(12) United States Patent
Chen et al.

(10) Patent No.: US 12,127,671 B2
(45) Date of Patent: Oct. 29, 2024

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 64 days.

(21) Appl. No.: 18/197,733

(22) Filed: May 16, 2023

(65) Prior Publication Data
US 2024/0215720 A1    Jul. 4, 2024

(30) Foreign Application Priority Data
Dec. 28, 2022   (TW) .................................. 111150803

(51) Int. Cl.
| | |
|---|---|
| F16C 29/02 | (2006.01) |
| A47B 88/40 | (2017.01) |
| A47B 88/45 | (2017.01) |
| A47B 88/49 | (2017.01) |

(52) U.S. Cl.
CPC .............. *A47B 88/45* (2017.01); *A47B 88/49* (2017.01); *F16C 29/02* (2013.01)

(58) Field of Classification Search
CPC ...... F16C 29/02; F16C 2314/72; A47B 88/45; A47B 88/49
See application file for complete search history.

(56) References Cited

U.S. PATENT DOCUMENTS

| | | | |
|---|---|---|---|
| 9,992,906 B2 * | 6/2018 | Chen | ..................... A47B 88/57 |
| 10,398,228 B2 * | 9/2019 | Chen | ................... A47B 88/473 |
| 10,791,833 B2 | 10/2020 | Chen | |
| 10,813,454 B1 * | 10/2020 | Chen | ..................... A47B 88/49 |
| 10,918,209 B1 | 2/2021 | Chen | |
| 11,641,939 B2 | 5/2023 | Chen | |
| 11,641,940 B2 | 5/2023 | Chen | |

(Continued)

FOREIGN PATENT DOCUMENTS

| | | | |
|---|---|---|---|
| CN | 112089231 A | 12/2020 | |
| CN | 112971407 A * | 6/2021 | ............. A47B 88/40 |

(Continued)

*Primary Examiner* — Phillip A Johnson
(74) *Attorney, Agent, or Firm* — Winston Hsu

(57) ABSTRACT

A slide rail assembly includes a supporting frame, a first rail, a second rail and a third rail. The first rail is movable relative to the supporting frame. The second rail is movable relative to the first rail. The third rail is movable relative to the second rail, and the second rail is movably mounted between the first rail and the third rail. The first rail can be moved to a second predetermined position from a first predetermined position in a retracting direction relative the supporting frame. The first rail can be retained at the second predetermined position so as to shorten a length of the slide rail assembly such that the third rail can be detached from the second rail easily in a limited environment.

20 Claims, 19 Drawing Sheets

(56) References Cited

U.S. PATENT DOCUMENTS

2013/0259410 A1    10/2013   Judge
2019/0313794 A1    10/2019   Tang
2021/0120951 A1*    4/2021   Chen ...................... A47B 88/57

FOREIGN PATENT DOCUMENTS

| JP | 2018-175843 | A |   | 11/2018 | | |
|----|-------------|---|---|---------|---|---|
| JP | 2019118791  | A | * | 7/2019  | ........... | A47B 88/443 |
| JP | 6644738     | B2| * | 2/2020  | ........... | A47B 88/437 |
| JP | 2020-131003 | A |   | 8/2020  | | |
| JP | 2021-53345  | A |   | 4/2021  | | |
| JP | 2022-83376  | A |   | 6/2022  | | |

* cited by examiner

SLIDE RAIL ASSEMBLY

BACKGROUND OF THE INVENTION

1. Field of the Invention

The present invention relates to a slide rail assembly, and more specifically, to a slide rail assembly having at least four rails and suitable for use in a limited environment.

2. Description of the Prior Art

U.S. Patent Publication No. 2022/0240673 A1 discloses a slide rail assembly including a first rail, a second rail, a third rail and a blocking mechanism. When the second rail moves relative to the first rail along a retracting direction from a first extended position to a second extended position, the blocking mechanism can prevent the second rail from leaving away from the second extended position, so as to reduce an overall length of the slide rail assembly for facilitating detachment of the third rail from the second rail in a limited environment.

However, the blocking mechanism disclosed by U.S. Patent Publication No. 2022/0240673 A1 is incompatible with a slide rail assembly having four or more rails. To meet different requirements, it becomes an important topic to provide a slide rail assembly having at least four rails and suitable for use in a limited environment.

SUMMARY OF THE INVENTION

The present invention provides a slide rail assembly having at least four rails and suitable for use in a limited environment.

According to an aspect of the present invention, a slide rail assembly includes a supporting frame, a first rail, a second rail, a third rail, a first working member and a second working member. A blocking structure and a positioning structure are arranged on the supporting frame. The first rail is movable relative to the supporting frame. A blocking feature and a positioning feature are arranged on the first rail. The second rail is movable relative to the first rail. The third rail is movable relative to the second rail, and the second rail is movably mounted between the first rail and the third rail. The first working member is movably mounted on the first rail and switchable between a first state and a second state relative to the first rail. The second working member is movably mounted on the first rail and switchable between a third state and a fourth state relative to the first rail. When the first rail is located at a first predetermined position relative to the supporting frame, the blocking structure blocks the first working member in the first state for preventing the first rail from moving along a retracting direction from the first predetermined position. When the first rail is located at a second predetermined position, the second working member in the third state engages with the positioning structure for preventing the first rail from moving along an opening direction from the second predetermined position.

According to another aspect of the present invention, a slide rail assembly includes a supporting frame, a first rail, a second rail, a third rail, a first working member and a second working member. The supporting frame includes a supporting channel, and a blocking structure and a positioning structure are arranged on the supporting frame. The first rail is at least partially movably mounted inside the supporting channel and movable relative to the supporting frame. A blocking feature and a positioning feature are arranged on the first rail. The second rail is movable relative to the first rail. The third rail is movable relative to the second rail. The second rail is movably mounted between the first rail and the third rail. The first working member and the second working member are movably mounted on the first rail, such that the first working member is movably mounted on the first rail and switchable between a first state and a second state relative to the first rail. The second working member is movably mounted on the first rail and switchable between a third state and a fourth state relative to the first rail. When the first rail is located at a first predetermined position relative to the supporting frame, the blocking structure blocks the first working member in the first state for preventing the first rail from moving along a retracting direction from the first predetermined position. When the first rail is located at the first predetermined position relative to the supporting frame and the first working member is driven to move from the first state to the second state by the second rail, the blocking structure does not block the first working member in the second state for allowing the first rail to move along the retracting direction from the first predetermined position to a second predetermined position. When the first rail is located at the second predetermined position relative to the supporting frame, the second working member in the third state engages with the positioning structure for preventing the first rail from moving along an opening direction from the second predetermined position.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure (s) being described. The members of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" is intended to mean either an indirect or direct mechanical connection. Thus, if a first device is connected to a second device, that connection may be through a direct mechanical connection, or through an indirect mechanical connection via other devices and connections.

Figure 1:
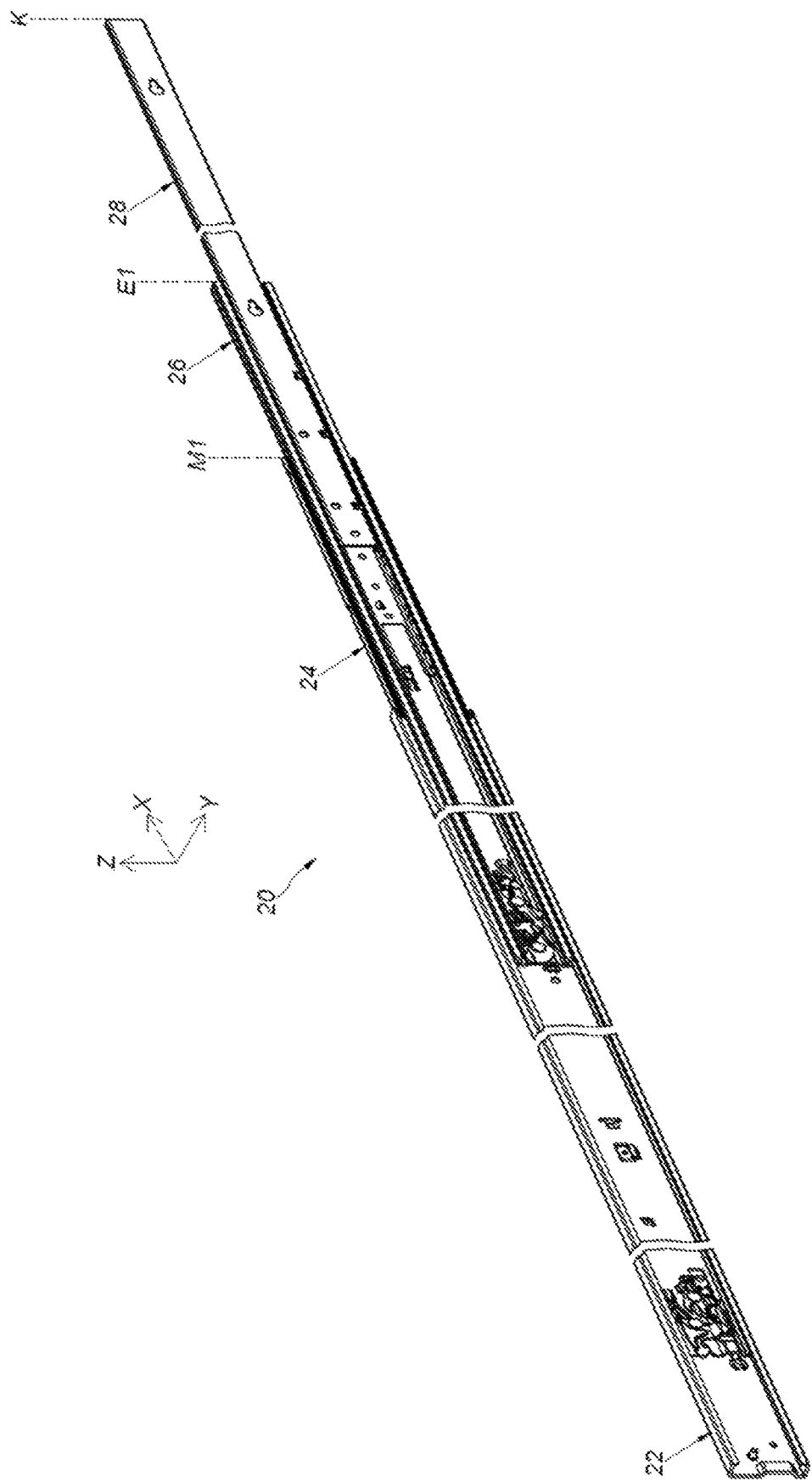
FIG. 1 is a schematic diagram of a slide rail assembly according to an embodiment of the present invention.

As shown in FIG. 1, a slide rail assembly 20 can be a multi-section rail assembly. In this embodiment, the slide rail assembly 20 can be a four-section rail assembly. Specifically, the slide rail assembly 20 includes a supporting frame 22, a first rail 24, a second rail 26 and a third rail 28. The second rail 26 is movably mounted between the first rail 24 and the third rail 28. For example, the first rail 24 can be an outer rail. The second rail 26 can be a middle rail. The third rail 28 can be an inner rail. The supporting frame 22 can be a fourth rail, which is used as a reinforced rail or a fixed rail. The supporting frame 22, the first rail 24, the second rail 26 and the third rail 28 can move relative to one another longitudinally. When the slide rail assembly 20 is in an extended state, e.g., a fully extended state, the first rail 24 is located at a first predetermined position M1 relative to the supporting frame 22, the second rail 26 is located at a first extended position E1 relative to the first rail 24, and the third rail 28 is located at an opened position K relative to the second rail 26. However, the present invention is not limited to this embodiment. For example, in another embodiment, the slide rail assembly can be a five-section rail assembly which includes an additional rail movably mounted on the supporting frame or the third rail.

It should be noticed that, in this embodiment, a longitudinal direction of the rail, i.e., a length direction or a moving direction of rail, can be parallel to an X axis. A transverse direction of the rail, i.e., a lateral direction of the rail, can be parallel to a Y axis. A vertical direction of the rail, i.e., a height direction of the rail, can be parallel to a Z axis.

Figure 2:
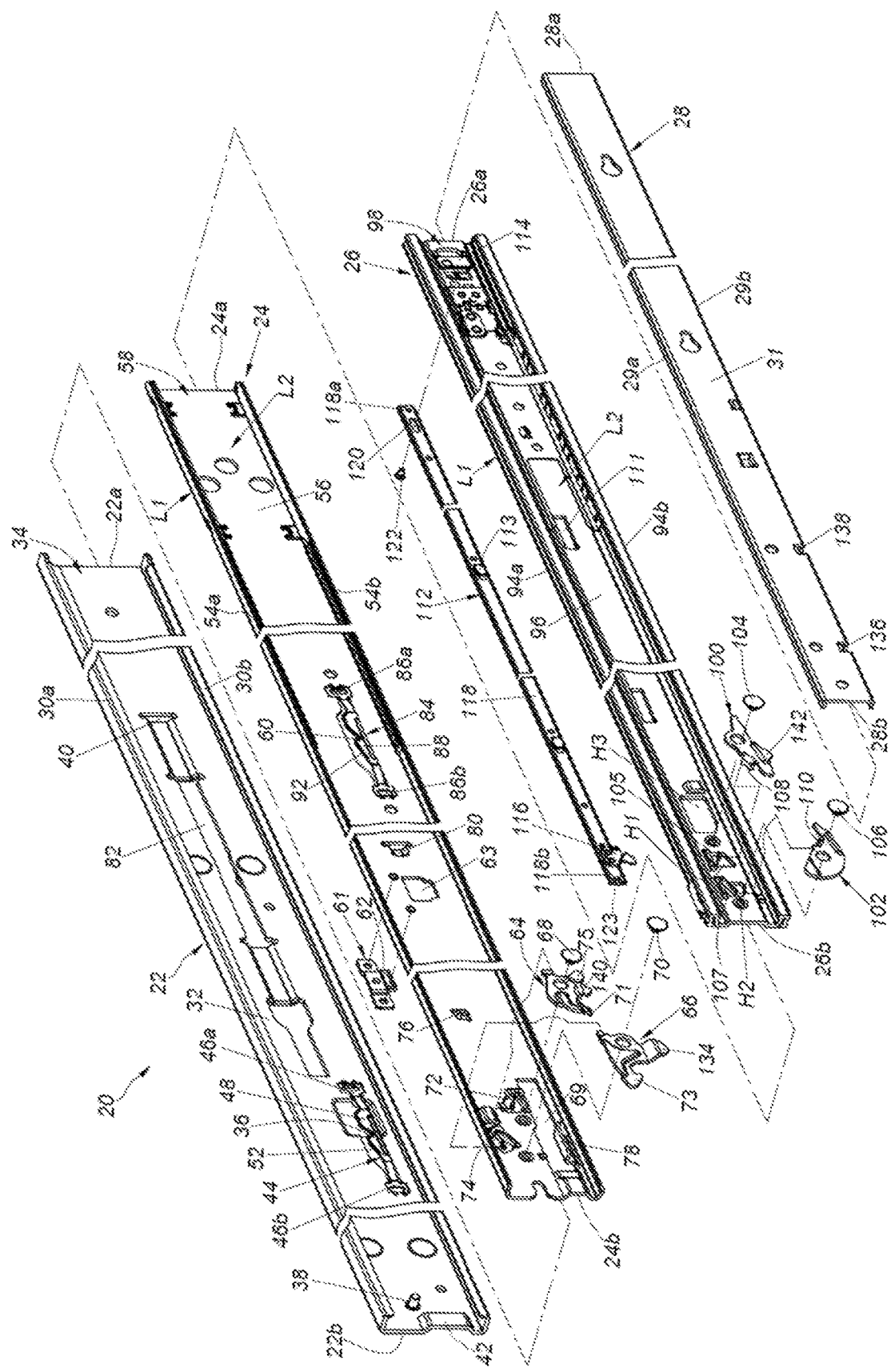
FIG. 2 is an exploded diagram of the slide rail assembly according to the embodiment of the present invention.
Figure 3:
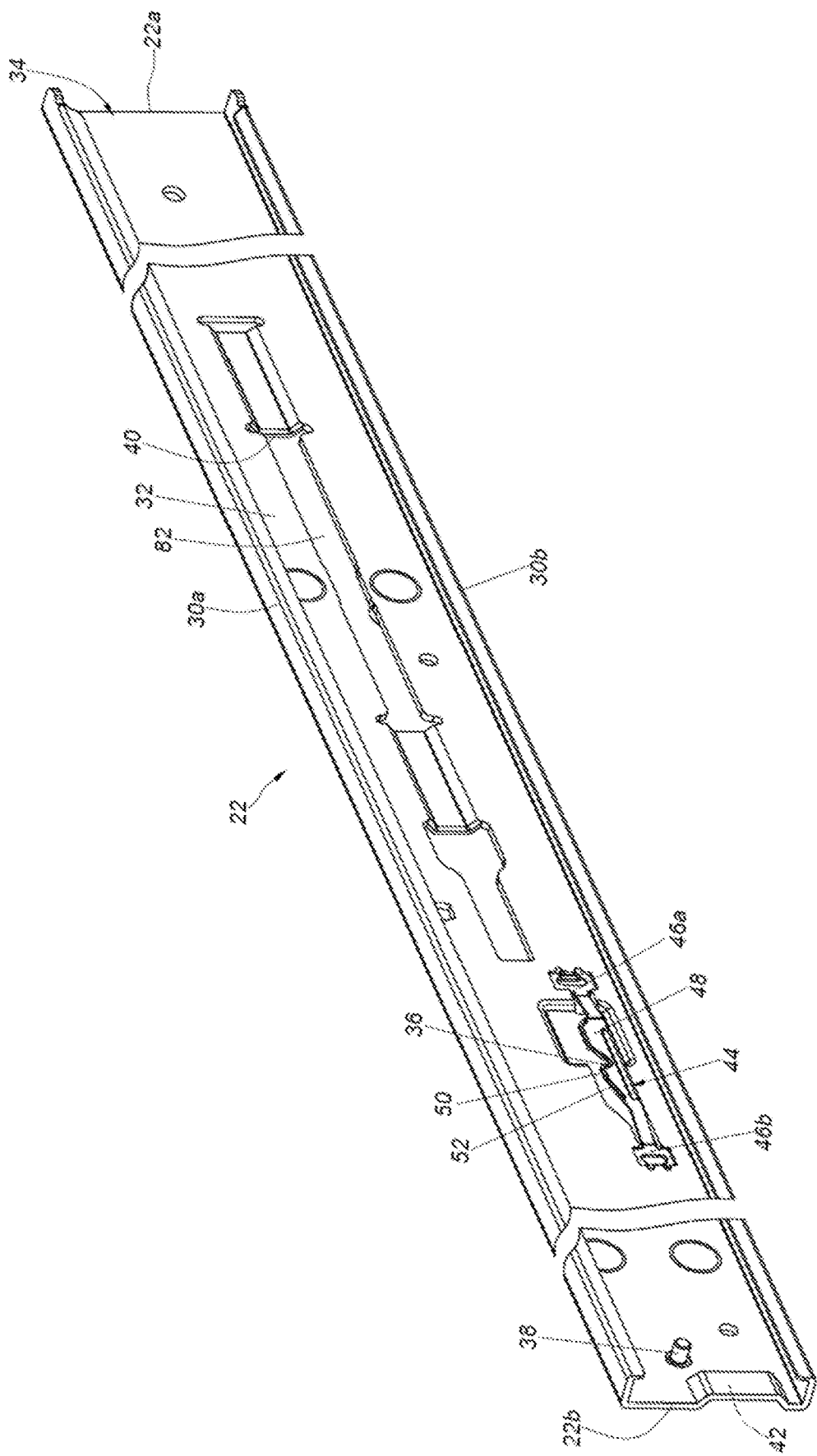
FIG. 3 is a diagram of a supporting frame according to the embodiment of the present invention.

As shown in FIG. 2 and FIG. 3, the supporting frame 22 includes a first wall 30a, a second wall 30b and a longitudinal wall 32 connected between the first wall 30a and the second wall 30b of the supporting frame 22. The first wall 30a, the second wall 30b and the longitudinal wall 32 of the supporting frame 22 cooperatively define a supporting channel 34 of the supporting frame 22. The supporting channel 34 is configured to at least partially accommodate the first rail 24. The supporting frame 22 further includes a front portion 22a and a rear portion 22b. A blocking structure 36 and a positioning structure 38 are arranged on the supporting frame 22.

Preferably, the supporting frame 22 further includes a front restraining feature 40 and a rear restraining feature 42. The front restraining feature 40 and the rear restraining feature 42 are configured to restrain a travel distance of the first rail 24. For example, the front restraining feature 40 and the rear restraining feature 42 can be protruding walls or protruding portions. However, the present invention is not limited thereto. Besides, the blocking structure 36 and the positioning structure 38 are located between the front restraining feature 40 and the rear restraining feature 42. In this embodiment, the front restraining feature 40, the blocking structure 36, the positioning structure 38 and the rear restraining feature 42 can be sequentially arranged on the longitudinal wall 32 of the supporting frame 22 from front to rear.

Preferably, the slide rail assembly 20 further includes an auxiliary resilient seat 44 arranged on the supporting frame 22. The auxiliary resilient seat 44 includes a first fixing portion 46a, a second fixing portion 46b and a middle portion 48. The first fixing portion 46a and the second fixing portion 46b are connected to the longitudinal wall 32 of the supporting frame 22. The middle portion 48 is located between the first fixing portion 46a and the second fixing portion 46b. The middle portion 48 includes the blocking structure 36, a longitudinal section 50 and a guiding section 52. The longitudinal section 50 is located between the blocking structure 36 and the guiding section 52. For example, the blocking structure 36 can be a blocking wall or an erecting wall, and the guiding section 52 can be an inclined surface or an arc surface. However, the present invention is not limited thereto.

Preferably, for example, the positioning feature 38 can be formed in a column shape or a protrusion. However, the present invention is not limited thereto.

Figure 4:
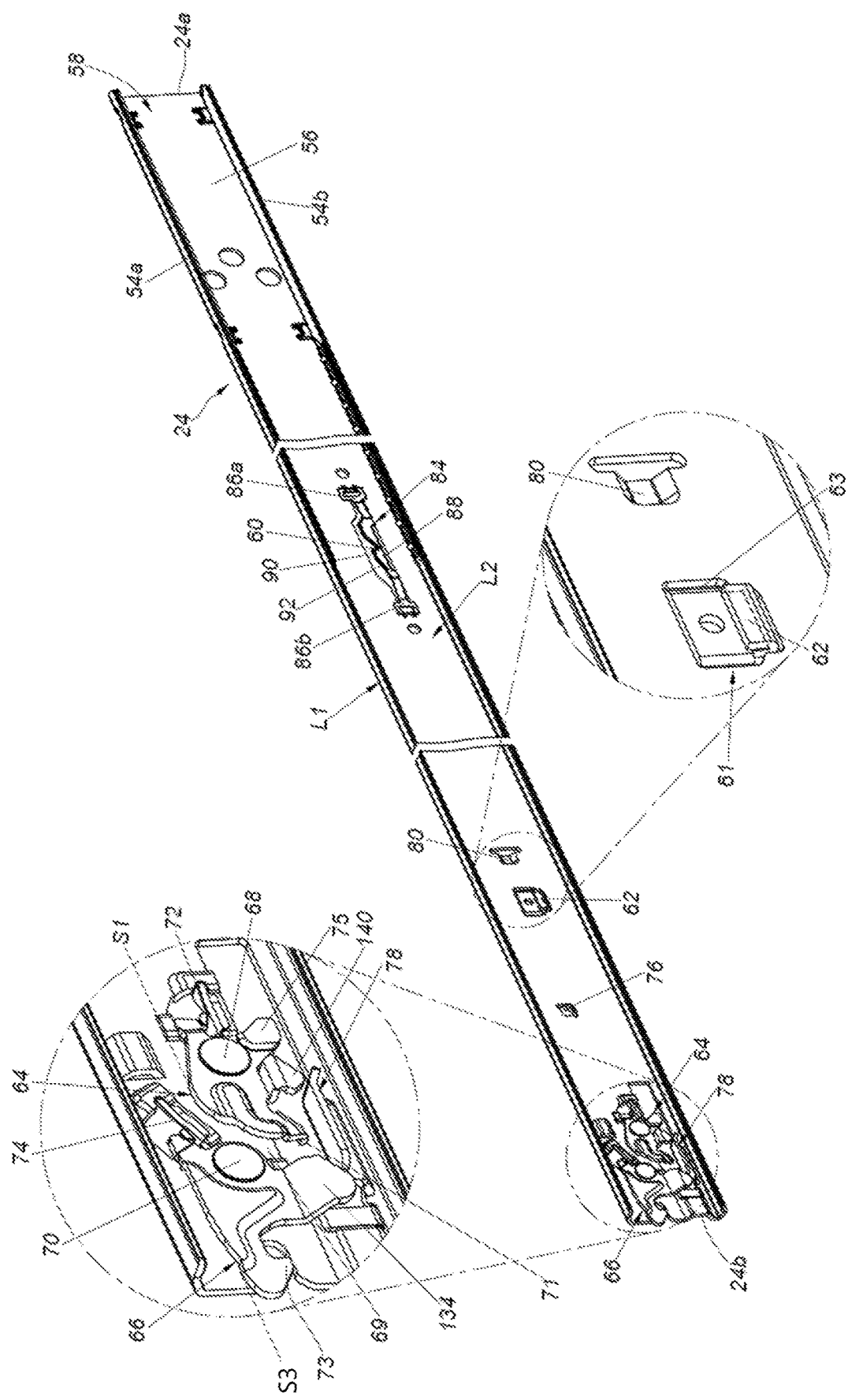
FIG. 4 is a diagram of a first rail according to the embodiment of the present invention.

As shown in FIG. 2 and FIG. 4, the first rail 24 is at least partially movably mounted inside the supporting channel 34 of the supporting frame 22 and movable relative to the supporting frame 22. The first rail 24 includes a first wall 54a, a second wall 54b and a longitudinal wall 56 connected between the first wall 54a and the second wall 54b of the first rail 24. The first wall 54a, the second wall 54b and the longitudinal wall 56 of the first rail 24 cooperatively define a first channel 58 of the first rail 24. The first channel 58 is configured to at least partially accommodate the second rail 26. The first rail 24 further includes a front portion 24a and a rear portion 24b. The first rail 24 further includes a first side L1 and a second side L2 opposite to the first side L1. The first side L1 of the first rail 24 is located adjacent to the supporting frame 22. The second side L2 of the first rail 24 is located adjacent to the second rail 26. A blocking feature 60 and a positioning feature 62 are arranged on the first rail 24. In this embodiment, a positioning member 61 can be arranged on the first rail 24 and connected, e.g., fixedly connected, to the first side L1 of the first rail 24. The positioning member 61 can include the positioning feature 62. The positioning feature 62 can extend from the first side L1 of the first rail 24 to the second side L2 of the first rail 24 through an auxiliary hole 63 on the first rail 24. However, the present invention is not limited to this embodiment. For example, in another embodiment, the positioning feature can be a protrusion arranged on the second side of the first rail.

The slide rail assembly 20 further includes a first working member 64 and a second working member 66. The first working member 64 is movably mounted on the first rail 24 and switchable between a first state S1 and a second state S2 relative to the first rail 24. The second working member 66 is movably mounted on the first rail 24 and switchable between a third state S3 and a fourth state S4 relative to the first rail 24. In this embodiment, the first working member 64 and the second working member 66 can be respectively pivotally connected to the longitudinal wall 56 of the first rail 24 by a first pivoting member 68 and a second pivoting member 70 and located at the second side L2 of the first rail 24. However, the present invention is not limited to this embodiment.

Preferably, the first rail 24 further includes an opening 69 communicated with the first side L1 and the second side L2 of the first rail 24. The first working member 64 includes a blocking portion 71 extending to the first side L1 of the first rail 24 through the opening 69. The blocking portion 71 is configured to cooperate with the blocking structure 36 of the supporting frame 22. The second working member 66 includes a positioning portion 73 configured to cooperate with the positioning structure 38 of the supporting frame 22. For example, the positioning portion 73 can be an engaging hook. However, the present invention is not limited thereto.

Preferably, the first working member 64 further includes a releasing portion 75 configured to cooperate with the second rail 26.

Preferably, the slide rail assembly 20 further includes a first resilient member 72 and a second resilient member 74 respectively configured to provide resilient forces to the first working member 64 and the second working member 66 to drive the first working member 64 and the second working member 66 to move to the first state S1 and the third state S3 relative to the first rail 24.

Preferably, a first auxiliary feature 76 and a supporting feature 78 are arranged on the first rail 24. The blocking feature 60, the positioning feature 62, the first auxiliary feature 76, the first working member 64 and the second working member 66 are sequentially arranged on the longitudinal wall 56 of the first rail 24 from front to rear.

Preferably, the first rail 24 further includes a front restraining portion 80 and a rear restraining portion respectively configured to cooperate with the front restraining feature 40 and the rear restraining feature 42 of the supporting frame 22 for restraining a travel distance of the first rail 24 relative to the supporting frame 22. In this embodiment, the front restraining portion 80 can be a protruding block located on the first side S1 of the first rail 24 and facing toward the longitudinal wall 32 of the supporting frame 22, and the front restraining portion 80 can stretch into a longitudinal space 82 of the longitudinal wall 32 of the supporting frame 22, e.g., a longitudinal slot of the longitudinal wall 32 of the supporting frame 22, so as to be located at a position corresponding to the front restraining feature 40. The rear restraining portion can be the rear portion 24b. However, the present invention is not limited to this embodiment.

Preferably, the slide rail assembly 20 further includes a resilient seat 84 arranged on the first rail 24. The resilient seat 84 includes a first connecting portion 86a, a second connecting portion 86b and a supporting structure 88. The first connecting portion 86a and the second connecting portion 86b are connected to the longitudinal wall 56 of the first rail 24. The supporting structure 88 is located between the first connecting portion 86a and the second connecting portion 86b. The supporting structure 88 includes the blocking feature 60, a longitudinal portion 90 and a guiding portion 92. The longitudinal portion 90 is located between the blocking feature 60 and the guiding portion 92. For example, the blocking feature 60 can be a blocking wall or an erecting wall, and the guiding portion 92 can be an inclined surface or an arc surface. However, the present invention is not limited thereto.

Figure 5:
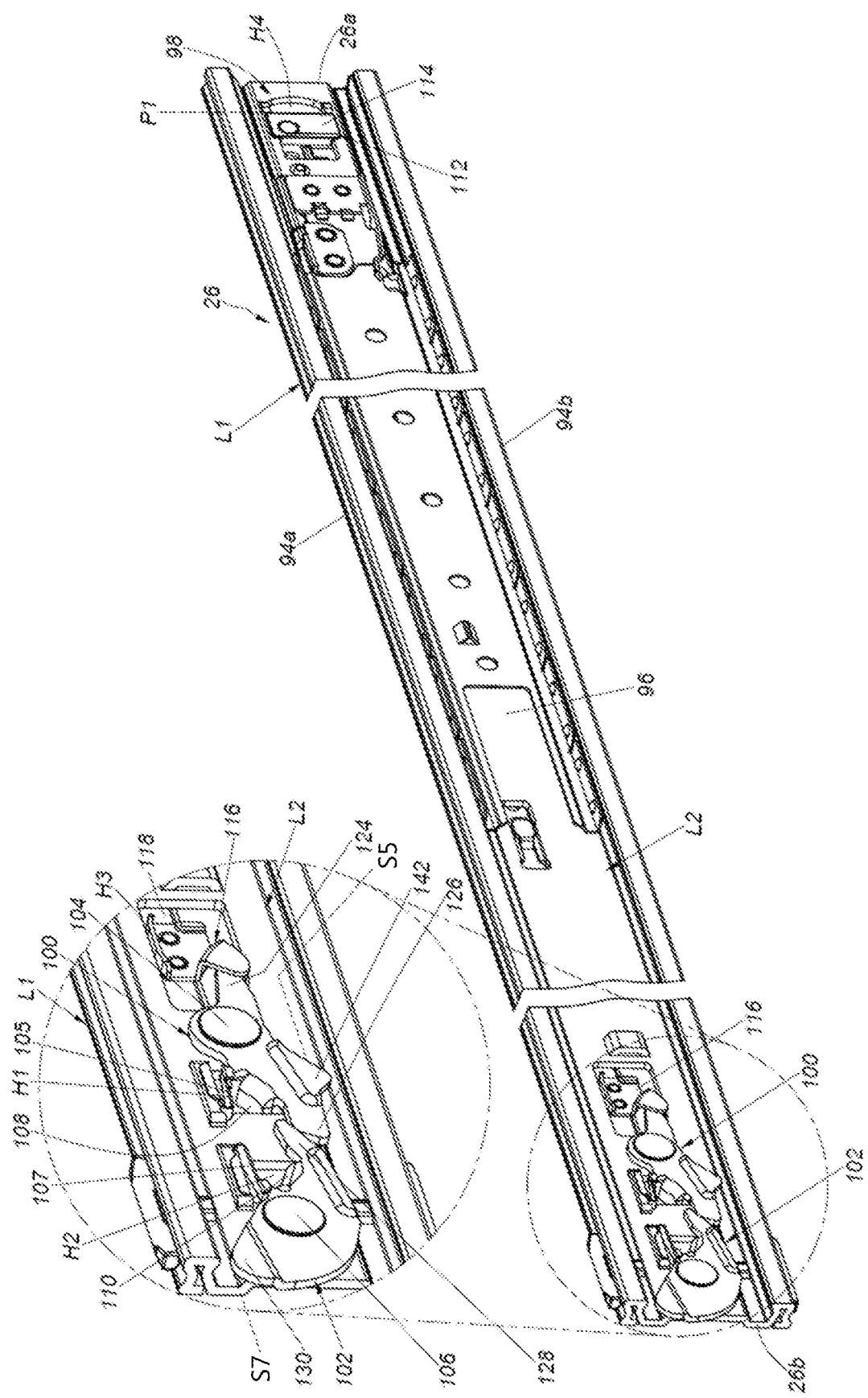
FIG. 5 and FIG. 6 are diagrams of a second rail at different views as an operating member is located at a first operated position according to the embodiment of the present invention.
Figure 6:
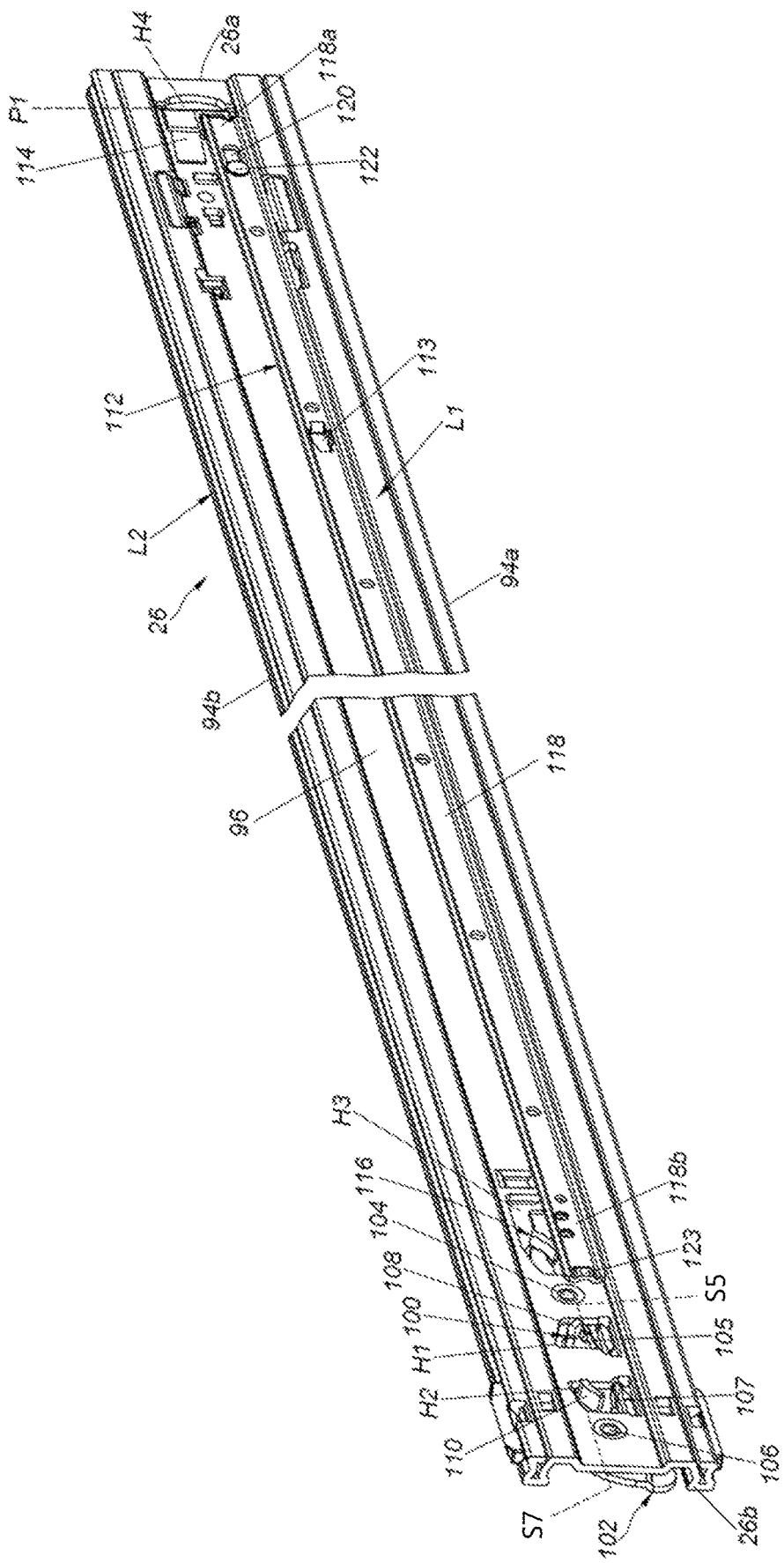

As shown in FIG. 2, FIG. 5 and FIG. 6, the second rail 26 is movable relative to the first rail 24. The second rail 26 includes a first wall 94a, a second wall 94b and a longitudinal wall 96 connected between the first wall 94a and the second wall 94b of the second rail 26. The first wall 94a, the second wall 94b and the longitudinal wall 96 of the second rail 26 cooperatively define a second channel 98 of the second rail 26. The second channel 98 is configured to at least partially accommodate the third rail 28. The second rail 26 further includes a front portion 26a and a rear portion 26b. The second rail 26 further includes a first side L1 and a second side L2 opposite to the first side L1. The first side L1 of the second rail 26 is located adjacent to the first rail 24. The second side L2 of the second rail 26 is located adjacent to the third rail 28.

Preferably, the slide rail assembly 20 further includes a third working member 100 and a fourth working member 102. The third working member 100 is movably mounted on the second rail 26 and switchable between a fifth state S5 and a sixth state S6 relative to the second rail 26. The fourth working member 102 is movably mounted on the second rail 26 and switchable between a seventh state S7 and a eighth state S8 relative to the second rail 26. In this embodiment, the third working member 100 and the fourth working member 102 can be respectively pivotally connected to the longitudinal wall 96 of the second rail 26 by a first shaft 104 and a second shaft 106 and located at the second side L2 of the second rail 26. However, the present invention is not limited to this embodiment.

Preferably, the slide rail assembly 20 further includes a first resilient feature 105 and a second resilient feature 107 respectively configured to provide resilient forces to the third working member 100 and the fourth working member 102 for driving the third working member 100 and the fourth working member 102 to move to the fifth state S5 and the seventh state S7 relative to the second rail 26.

Preferably, the second rail 26 further includes at least one hole arranged on the longitudinal wall 96 of the second rail 26 and communicated with the first side L1 and the second side L2 of the second rail 26. In this embodiment, the second rail 26 can include a first hole H1 and a second hole H2. Furthermore, the third working member 100 includes a first blocking section 108 stretching into the first hole H1. The first blocking section 108 faces toward the longitudinal wall 56 of the first rail 24 and is configured to cooperate with the blocking feature 60 or the positioning feature 62 of the first rail 24. The fourth working member 102 includes a second blocking section 110 stretching into the second hole H2. The second blocking section 110 faces toward the longitudinal wall 56 of the first rail 24 and is configured to cooperate with the positioning feature 62 of the first rail 24. However, the present invention is not limited to this embodiment. For example, in another embodiment, there can be only one hole arranged on the longitudinal wall of the second rail for the first blocking section and the second blocking section to pass therethrough.

Preferably, the slide rail assembly 20 further includes an operating member 112 movably mounted on the second rail 26 and configured to operate one of the third working member 100 and the fourth working member 102.

Preferably, the operating member 112 is mounted on the longitudinal wall 96 of the second rail 26 and located at the first side L1 of the second rail 26. The operating member 112 includes an operating portion 114, a driving portion 116 and an extending portion 118 connected between the operating portion 114 and the driving portion 116. The operating portion 114 is connected to a front end 118a of the extending portion 118. The operating portion 114 is located adjacent to the front portion 26a of the second rail 26. The driving portion 116 is connected to a rear end 118b of the extending portion 118. The driving portion 116 is located adjacent to the rear portion 26b of the second rail 26. Besides, the third working member 100 and the fourth working member 102 are located adjacent to the rear portion 26b of the second rail 26.

Preferably, the second rail 26 further includes a third hole H3 arranged on the longitudinal wall 96 of the second rail 26. The driving portion 116 of the operating member 112 extends from the first side L1 to the second side L2 of the second rail 26 through the third hole H3 and is located adjacent to the third working member 100.

Preferably, the second rail 26 further includes a fourth hole H4 arranged on the longitudinal wall 96 of the second rail 26. The operating portion 114 of the operating member 112 is exposed on the second side L2 of the second rail 26 via the fourth hole H4.

Preferably, the second rail 26 and the operating member 112 have corresponding restraining features cooperating with each other for restraining a travel distance of the operating member 112 relative to the second rail 26. In this embodiment, at least one elongated hole 120 can be arranged on the extending portion 118 of the operating member 112. The second rail 26 can further include at least one connecting member 122 connected to the longitudinal wall 96 of the second rail 26 and passing through a portion of the at least one elongated hole 120. Furthermore, the second rail 26 can further include at least one extending hole 111. At least one connecting section 113 can be arranged on the extending portion 118 of the operating member 112 and passes through a portion of the at least one extending hole 111. The travel distance of the operating member 112 relative to the second rail 26 can be restrained by a cooperation of the at least one elongated hole 120 and the at least one connecting member 122 and a cooperation of the at least one extending hole 111 and the at least one connecting section 113. However, the present invention is not limited to this embodiment. For example, in another embodiment, there can be only the elongated hole and the at least one connecting member cooperating with each other. Alternatively, in another embodiment, there can be only the extending hole and the connecting section cooperating with each other.

Preferably, as shown in FIG. 2 and FIG. 6, a second auxiliary feature 123 is arranged on the operating member 112 and configured to cooperate with the first auxiliary feature 76 of the first rail 24. For example, the first auxiliary feature 76 and the second auxiliary feature 123 can be protrusions. However, the present invention is not limited thereto. Besides, as shown in FIG. 6, the second auxiliary feature 123 is arranged adjacent to the rear end 118b of the extending portion 118 of the operating member 112, and the second auxiliary feature 123 and the driving portion 116 are located at two opposite sides of the extending portion 118 of the operating member 112.

When the operating member 112 is located at a first operated position P1 relative to the second rail 26 as shown in FIG. 5 and FIG. 6, the third working member 100 and the fourth working member 102 are respectively in the fifth state S3 and the seventh state S7 relative to the second rail 26.

Preferably, as shown in FIG. 5, the third working member 100 further includes an abutting portion 124 and an actuating portion 126. The first shaft 104 is located between the abutting portion 124 and the actuating portion 126. The abutting portion 124 is located at a position corresponding to the driving portion 116 of the operating member 112 and for abutting against the driving portion 116 of the operating member 112. The first blocking section 108 is located adjacent to the actuating portion 126. The first blocking section 108 extends to the first side L1 of the second rail 26. The first resilient feature 105 is configured to provide the resilient force to the third working member 100 for retaining the third working member 100 in the fifth state S5.

Preferably, as shown in FIG. 5, the fourth working member 102 includes an abutting section 128 and an actuating section 130. The second shaft 106 is located between the abutting section 128 and the actuating section 130. The second blocking section 110 is located adjacent to the abutting section 128. The second blocking section 110 extends to the first side L1 of the second rail 26. The second resilient feature 107 is configured to provide the resilient force to the fourth working member 102 for retaining the fourth working member 102 in the seventh state S7.

Figure 7:
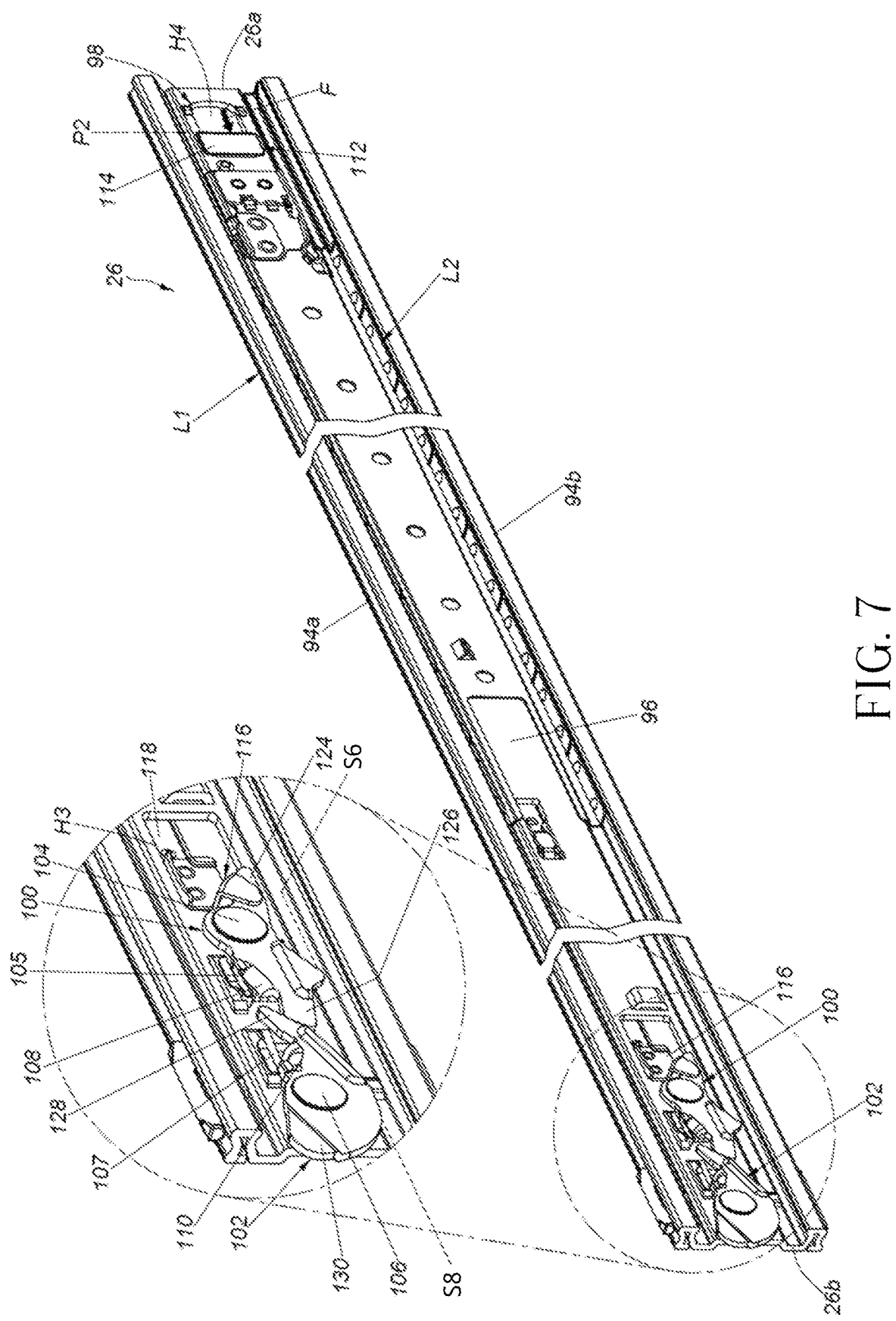
FIG. 7 and FIG. 8 are diagrams of the second rail at different views as the operating member is located at a second operated position according to the embodiment of the present invention.
Figure 8:
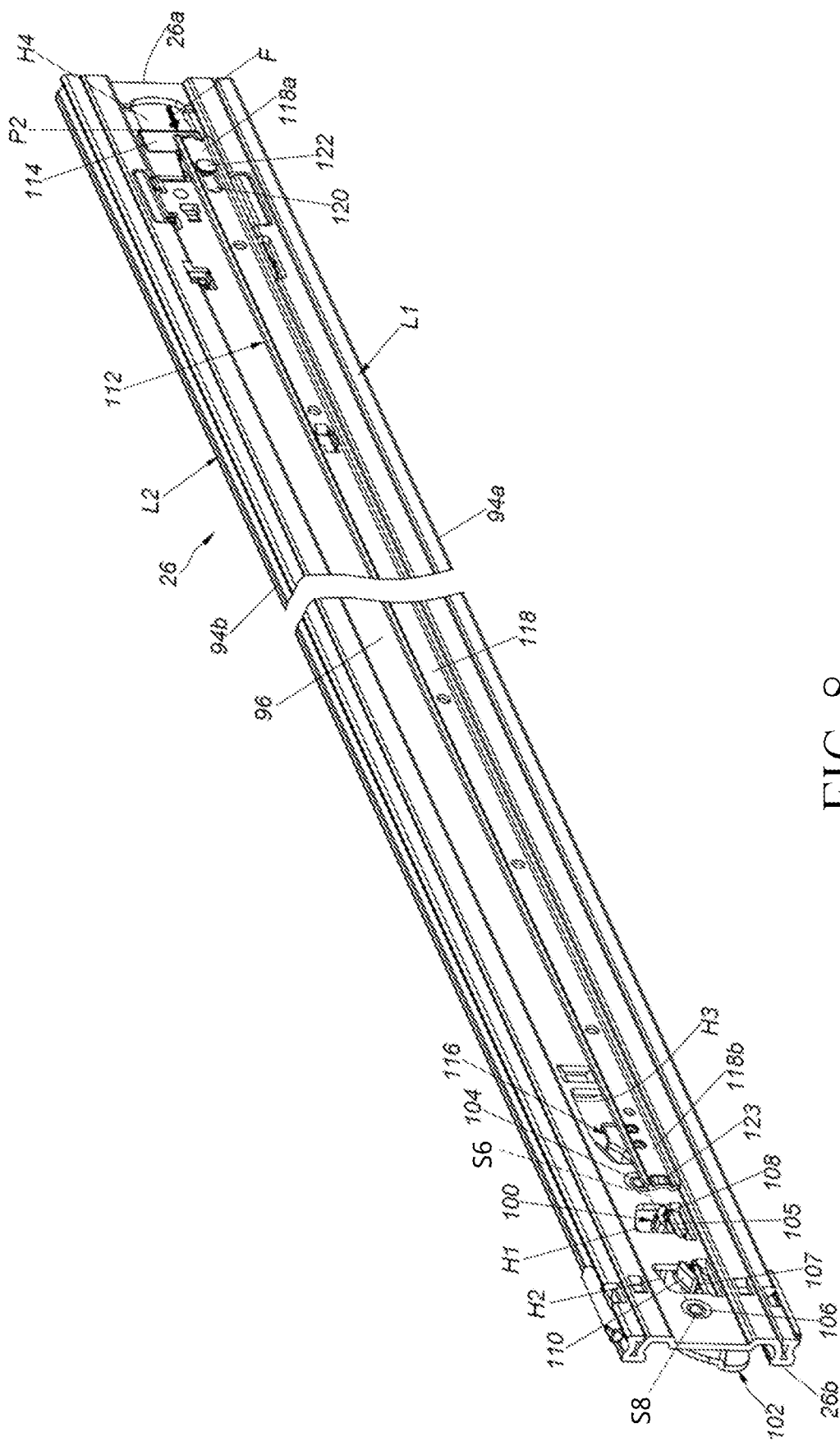

As shown in FIG. 5 to FIG. 8, the user can apply a force F onto the operating member 112, e.g., the operating portion 114 of the operating member 112, to drive the operating member 112 to move relative to the second rail 26 from the first operated position P1 to a second operated position P2. During the aforementioned process, the operating member 112 drives the third working member 100 to move, e.g., pivot, relative to the second rail 26 from the fifth state S5 as shown in FIG. 5 and FIG. 6 to the sixth state S6 as shown in FIG. 7 and FIG. 8 by an abutment of the driving portion 116 and the abutting portion 124 of the third working member 100. Preferably, when the third working member 100 moves from the fifth state S5 as shown in FIG. 5 and FIG. 6 to the sixth state S6 as shown in FIG. 7 and FIG. 8, the third working member 100 drives the fourth working member 102 to move, e.g., pivot, relative to the second rail 26 from the seventh state S7 as shown in FIG. 5 and FIG. 6 to the eighth state S8 as shown in FIG. 7 and FIG. 8 by an abutment of the actuating portion 126 and the abutting section 128 of the fourth working member 102. In other words, in this embodiment, the third working member 100 and the fourth working member 102 are configured to move synchronously, and the third working member 100 and the fourth working member 102 are respectively configured to be driven by the operating member 112 and the third working member 100. However, the present invention is not limited to this embodiment. For example, in another embodiment, the third working member and the fourth working member are configured to move synchronously, and the third working member and the fourth working member are respectively configured to be driven by the fourth working member and the operating member. Alternatively, the third working member and the fourth working member are configured to move synchronously, and the third working member and the fourth working member are configured to be driven by two driving portions of the operating member respectively. Alternatively, the t slide rail assembly further includes an auxiliary operating member, and the third working member and the fourth working member are configured to be driven by the operating member and the auxiliary operating member respectively and to move asynchronously.

Preferably, as shown in FIG. 7 and FIG. 8, when the operating member 112 is located at the second operated position P2, the third working member 100 and the fourth working member 102 are respectively retained in the sixth state S6 and the eighth state S8 by an abutment of the operating member 112 and the third working member 100 and an abutment of the third working member 100 and the fourth working member 102.

Figure 9:
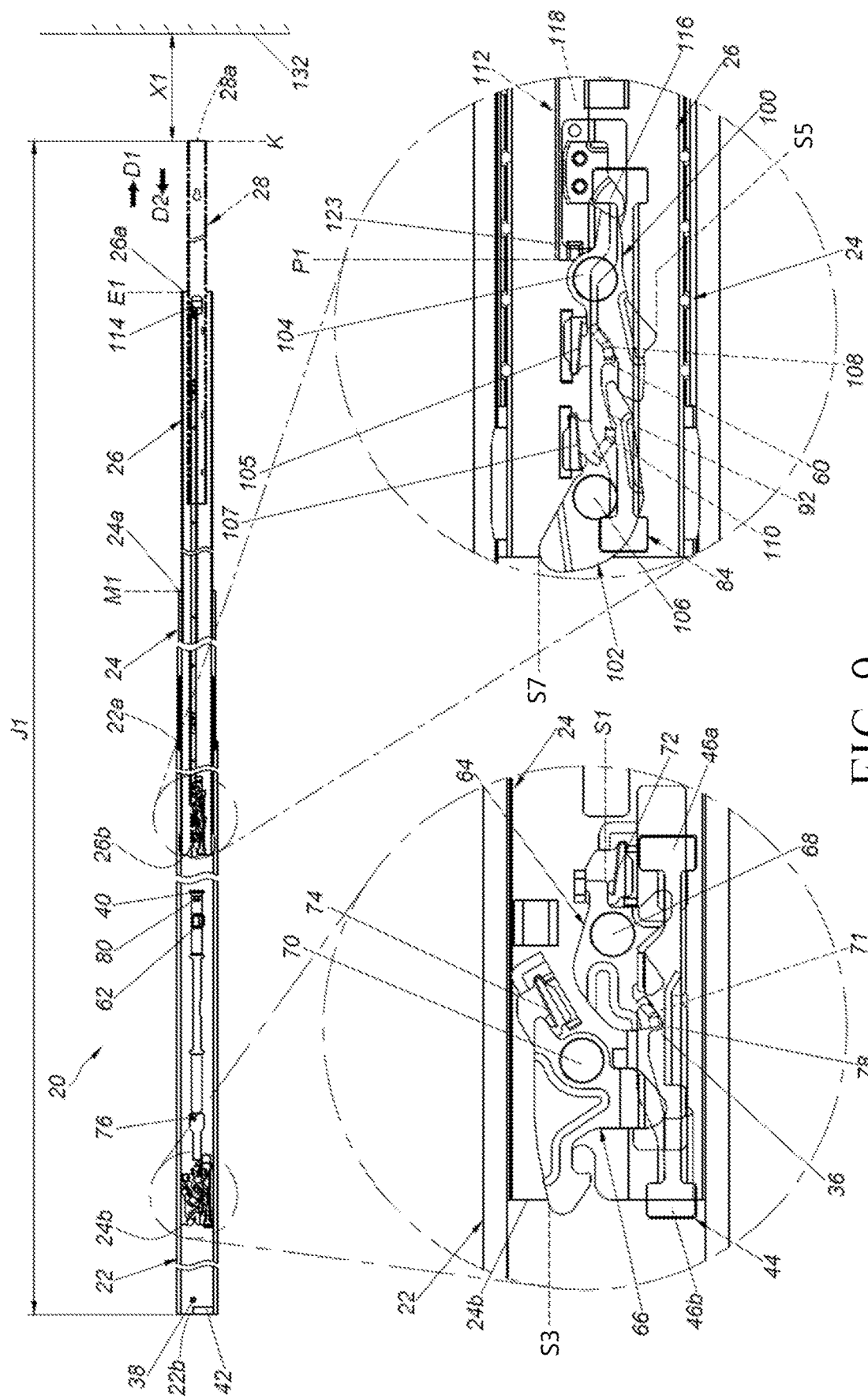
FIG. 9 is a diagram of the slide rail assembly as the second rail is locked at a first extended position according to the embodiment of the present invention.

As shown in FIG. 9, the slide rail assembly 20 is used in a limited environment and located in the extended state. As mentioned above, when the slide rail assembly 20 is located in the extended state, the first rail 24 is located at the first predetermined position M1 relative to the supporting frame 22, the second rail 26 is located at the first extended position E1 relative to the first rail 24, and the third rail 28 is located at the opened position K1 relative to the second rail 26. At this moment, the slide rail assembly 20 has a first length J1, and a front portion 28a of the third rail 28 is spaced apart from an object 132, e.g., a door or an obstruction, by a first distance X1. The first distance X1 is too short to detach the third rail 28 from the second rail 26, e.g., the second channel 98 of the second rail 26, along an opening direction D1.

Specifically, when the first rail 24 is located at the first predetermined position M1 relative to the supporting frame 22 as shown in FIG. 9, the blocking structure 36 of the supporting frame 22 blocks the blocking portion 71 of the first working member 64 in the first state S1 for preventing the first rail 24 from moving along a retracting direction D2 from the first predetermined position M1. Besides, at this moment, the operating member 112 is located at the first operated position P1, similarly to FIG. 5 and FIG. 6. Therefore, when the second rail 26 is located at the first extended position E1 relative to the first rail 24, the blocking feature 60 of the first rail 24 blocks the first blocking section 108 of the third working member 100 in the fifth state S5 for preventing the second rail 26 from moving along the retracting direction D2 from the first extended position E1, and the second blocking section 110 of the fourth working member 102 is located adjacent to the guiding portion 92 of the resilient seat 84 of the first rail 24. It should be noticed that when the third working member 100 and the fourth working member 102 are respectively in the fifth state S5 and the seventh state S7, the first blocking section 108 of the third working member 100 and the second blocking section 110 of the fourth working member 102 are located at positions where the first blocking section 108 of the third working member 100 and the second blocking section 110 of the fourth working member 102 are aligned with the positioning feature 62 of the first rail 24 along the retracting direction D2 or the opening direction D1.

Figure 10:
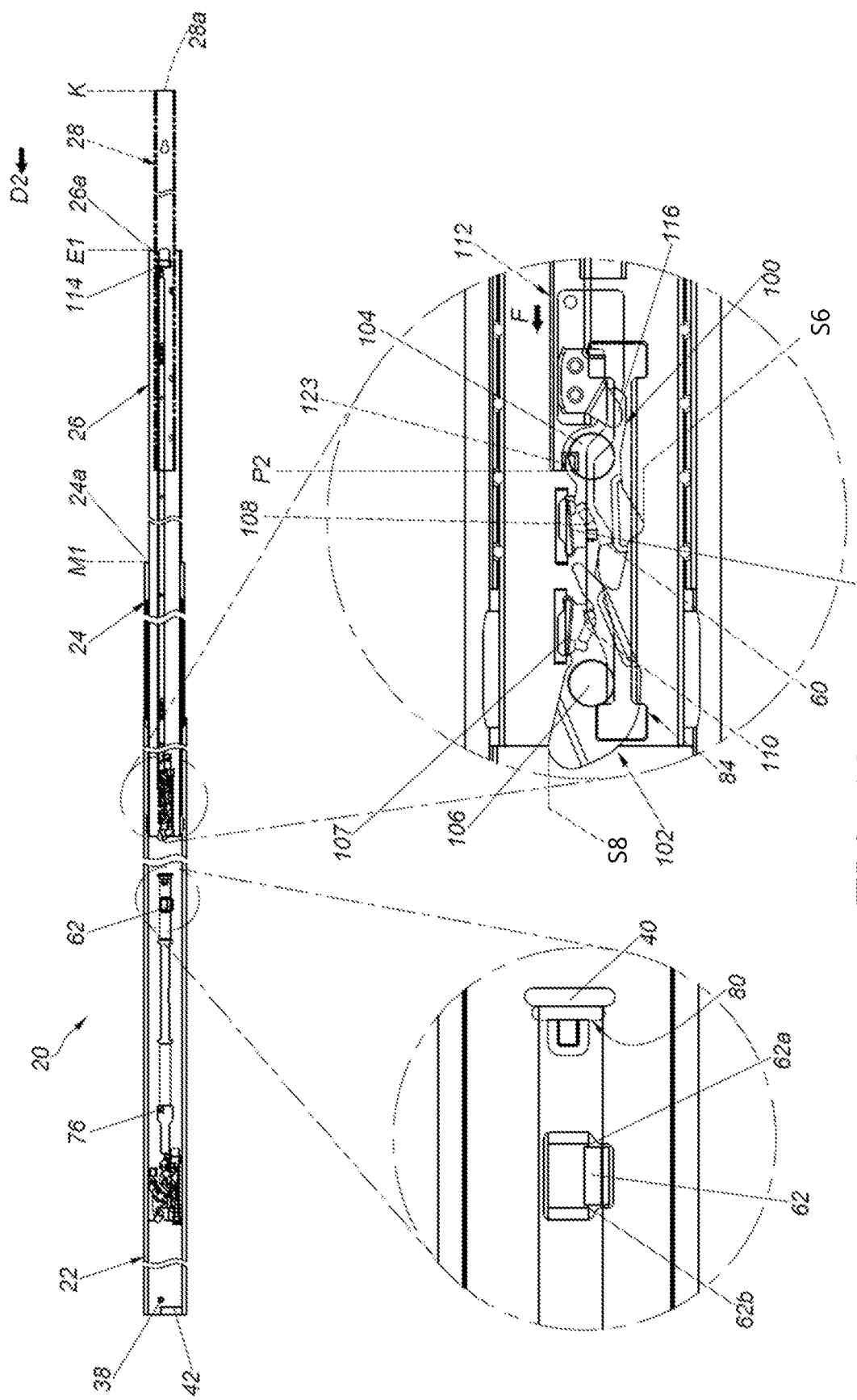
FIG. 10 is a diagram of the slide rail assembly as the second rail is unlocked and movable along a retracting direction from the first extended position according to the embodiment of the present invention.

As shown in FIG. 10, when the user applies the force F onto the operating member 112, e.g., the operating portion 114 of the operating member 112, to drive the operating member 112 to move from the first operated position P1 to the second operated position P2, the operating member 112 drives the third working member 100 by the driving portion 116 to move from the fifth state S5 to the sixth state S6, such that the blocking feature 60 cannot block the first blocking section 108 of the third working member 100 in the sixth state S6 for allowing the second rail 26 to move relative to the first rail 24 along the retracting direction D2 from the first extended position E1.

Furthermore, when the operating member 112 is located at the second operated position P2 as shown in FIG. 10, the third working member 100 and the fourth working member 102 are respectively retained in the sixth state S6 and the eighth state S8, such that the first resilient feature 105 and the second resilient feature 107 are resiliently deformed to generate the resilient forces, similarly to FIG. 7. Besides, when the third working member 100 and the fourth working member 102 are respectively in the sixth state S6 and the eighth state S8, the first blocking section 108 of the third working member 100 and the second blocking section 110 of the fourth working member 102 are dislocated from the positions where the first blocking section 108 of the third working member 100 and the second blocking section 110 of the fourth working member 102 are aligned with the positioning feature 62 of the first rail 24 along the retracting direction D2 or the opening direction D1. Moreover, as shown in FIG. 10, when the second rail 26 is located at the first extended position E1 relative to the first rail 24, the second auxiliary feature 123 of the operating member 112 is separated away from the first auxiliary feature 76 of the first rail 24 by a distance.

Figure 11:
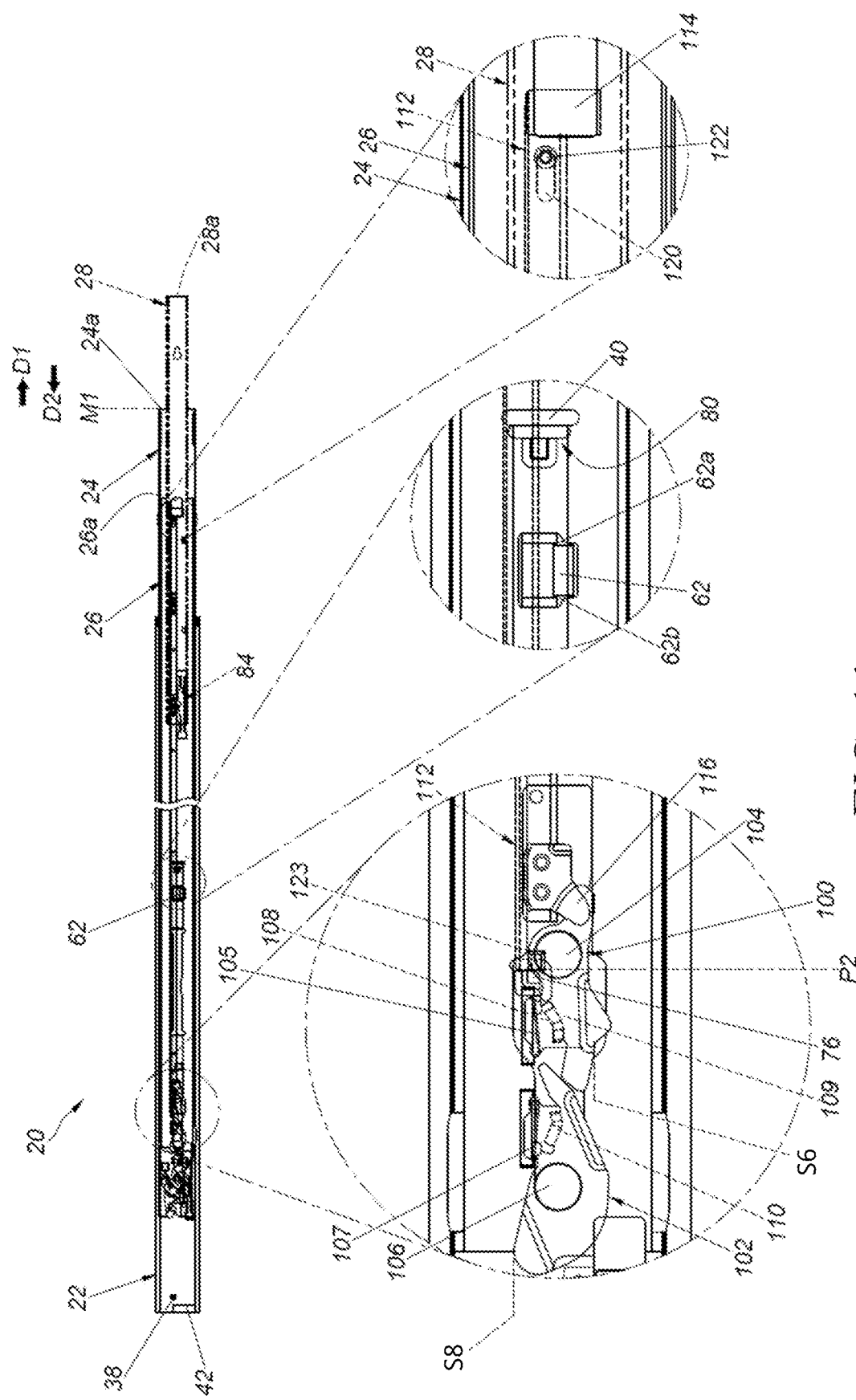
FIG. 11 is a diagram of the slide rail assembly as the second rail moves along the retracting direction beyond a second extended position according to the embodiment of the present invention.

During a movement of the second rail 26 relative to the first rail 24 along the retracting direction D2 from the first extended position E as shown in FIG. 10 to a predetermined retracted position as shown in FIG. 11, the first blocking section 108 of the third working member 100 and the second blocking section 110 of the fourth working member 102 can pass over the positioning feature 62 of the first rail 24 along the retracting direction D2 to allow the second rail 26 to move to the predetermined retracted position without any interference because the first blocking section 108 of the third working member 100 and the second blocking section 110 of the fourth working member 102 are dislocated from the positions where the first blocking section 108 of the third working member 100 and the second blocking section 110 of the fourth working member 102 are aligned with the positioning feature 62 of the first rail 24 along the retracting direction D2 or the opening direction D1. Afterwards, when the second rail 26 moves along the retracting direction D2 for a predetermined distance, the first auxiliary feature 76 of the first rail 24 abuts against the second auxiliary feature 123 of the operating member 112 to drive the operating member 112 to move from the second operated position P2 to the first operated position P1, such that the third working member 100 is driven to move from the sixth state S6 to the fifth state S5 by the first resilient feature 105, and the fourth working member 102 is driven to move from the eighth state S8 to the seventh state S7 by the second resilient feature 107. Preferably, as shown in FIG. 11, the positioning feature 62 includes a front portion 62a and a rear portion 62b. One of the first blocking section 108 of the third working member 100 and the rear portion 62b of the positioning feature 62 includes a guiding feature 109. For example, the guiding feature 109 can be an inclined surface or an arc surface. In this embodiment, the first blocking section 108 can include the guiding feature 109. However, the present invention is not limited to this embodiment.

Figure 12:
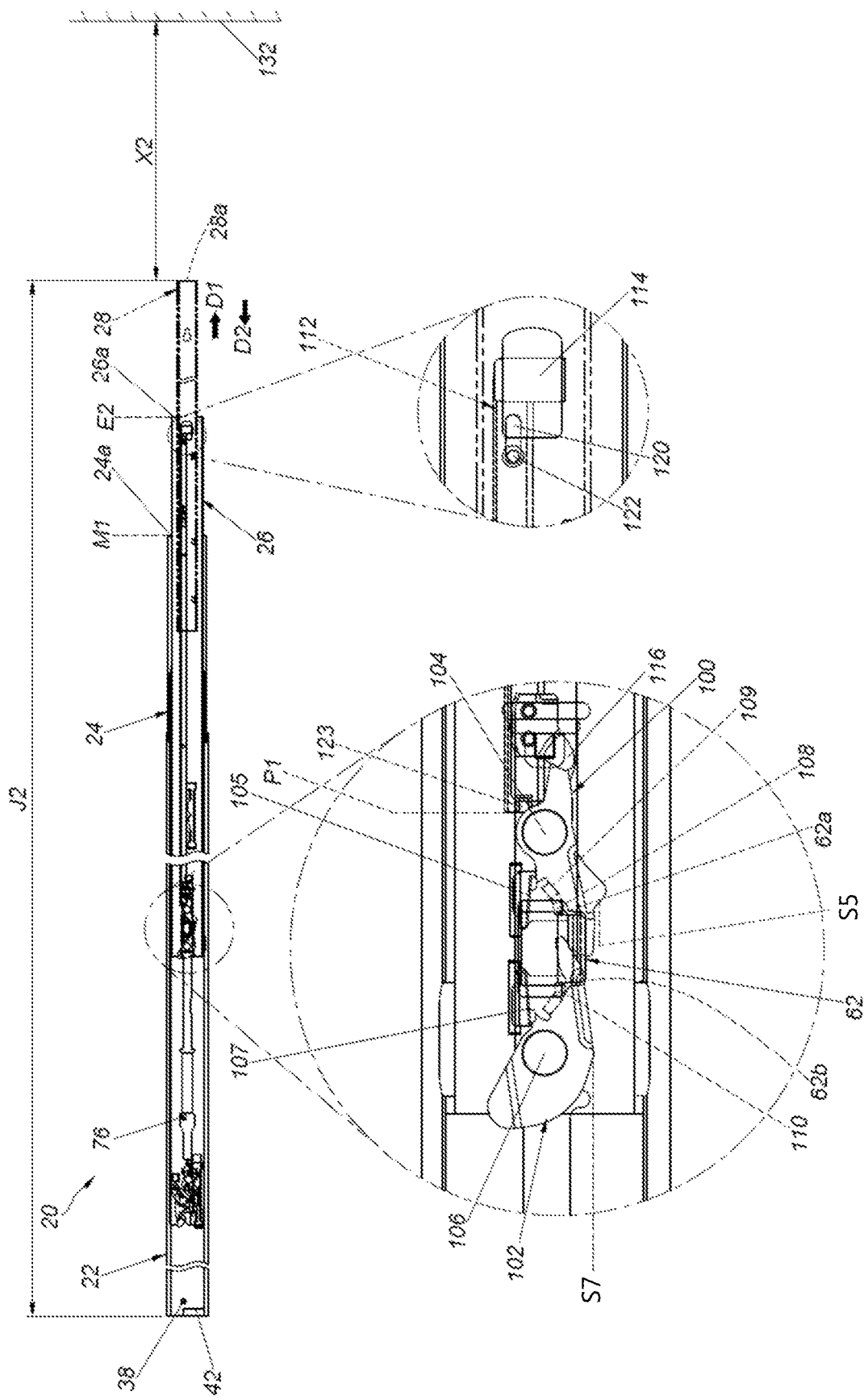
FIG. 12 is a diagram of the slide rail assembly as the second rail is locked at the second extended position according to the embodiment of the present invention.

Furthermore, the second rail 26 is movable relative to the first rail 24 along the opening direction D1 from the predetermined retracted position as shown in FIG. 11 to a second extended position E2 as shown in FIG. 12. During the aforementioned process, the first blocking section 108 of the third working member 100 and the rear portion 62b of the positioning feature 62 can abut against each other, and the third working member 100 can be driven to move from the fifth state S5 to the sixth state S6 for facilitating the first blocking section 108 of the third working member 100 to pass over the rear portion 62b of the positioning feature 62 along the opening direction D1 due to the guiding feature 109 of the first blocking section 108 of the third working member 100. When the third working member 100 moves from the fifth state S5 to the sixth state S6, the third working member 100 drives the fourth working member 102 to move from the seventh state S7 to the eighth state S8, such that the first resilient feature 105 and the second resilient feature 107 are resiliently deformed and generate the resilient forces. Therefore, the first resilient feature 105 and the second resilient feature 107 respectively can drive the third working member 100 and the fourth working member 102 to move to the fifth state S5 and the seventh state S7 when the second rail 26 moves to the second extended position E2 relative to the first rail 24. Besides, when the second rail 26 is located at the second extended position E2 as shown in FIG. 12 relative to the first rail 24, the second blocking section 110 of the fourth working member 102 in the seventh state S7 and the first blocking section 108 of the third working member 100 in the fifth state S5 are respectively located at positions corresponding to the two portions of the positioning feature 62, e.g., the rear portion 62b and the front portion 62a, so as to provide a blocking effect or an engaging effect for preventing the second rail 26 from moving relative to the first rail 24 along the opening direction D1 or the retracting direction D2 from the second extended position E2.

It should be noticed that when the second rail 26 is located at the second extended position E2 relative to the first rail 24, the slide rail assembly 20 has a second length J2 less than the first length J1, such that the front portion 28a of the third rail 28 is spaced apart from the object 132 by a second distance X2 greater than the first distance X1, which facilitates detachment of the third rail 28 from the second rail 26, e.g., the second channel 98 of the second rail 26, along the opening direction D1.

Figure 13:
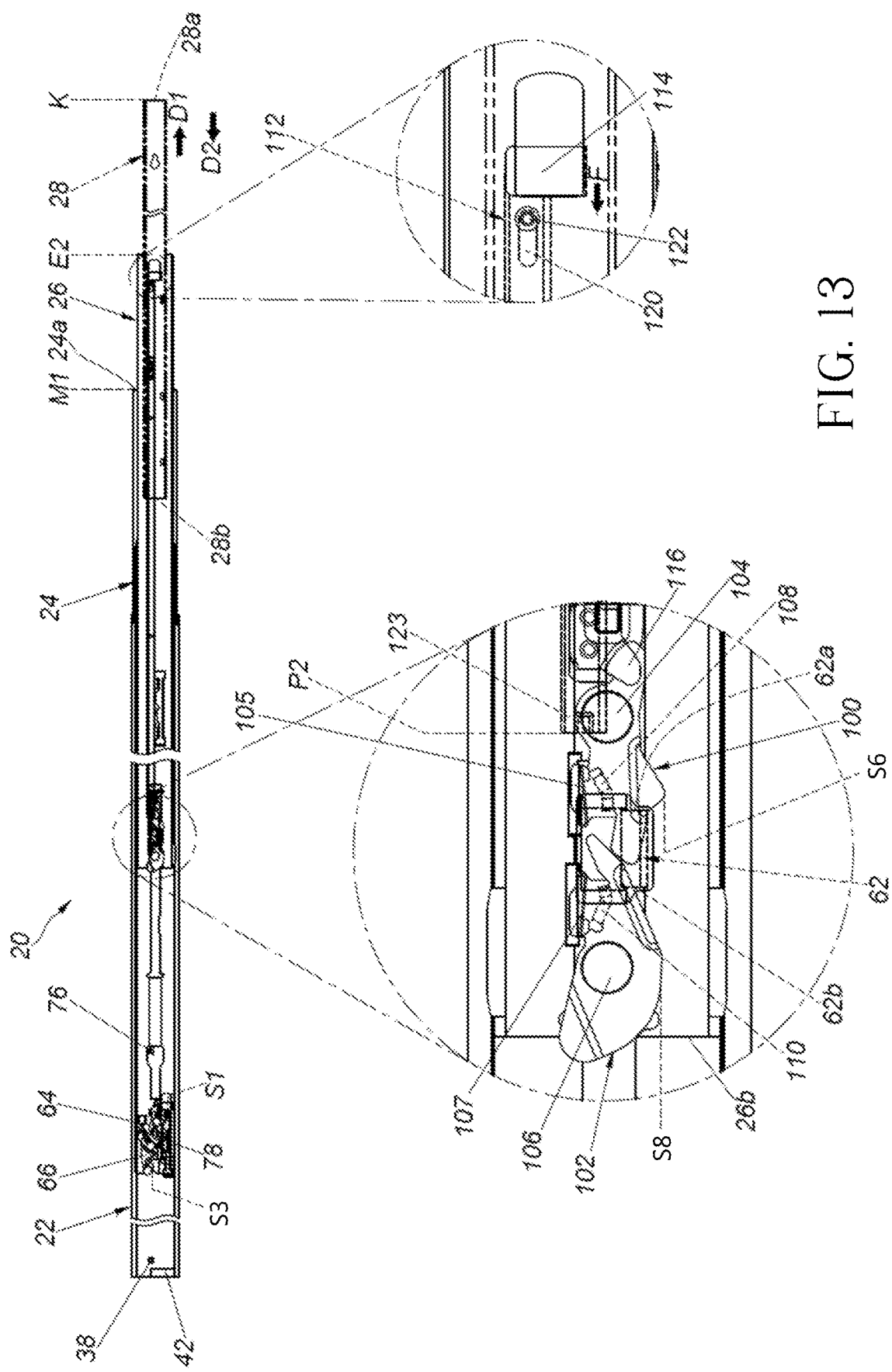
FIG. 13 is a diagram of the slide rail assembly as the second rail is unlocked and movable along the retracting direction or an opening direction from the second extended position according to the embodiment of the present invention.

When the second rail 26 is located at the second extended position E2 relative to the first rail 24, the user can apply the force F onto the operating member 112 to drive the operating member 112 to move from the first operated position P1 as shown in FIG. 12 to the second operated position P2 as shown in FIG. 13, so as to drive the third working member 100 to move from the fifth state S5 to the sixth state S6 and to drive the fourth working member 102 to move from the seventh state S7 to the eighth state S8. When the third working member 100 and the fourth working member 102 move to the sixth state S6 and the eighth state S8 respectively, the third working member 100 and the fourth working member 102 are respectively dislocated from the positions corresponding to the two portions of the positioning feature 62, e.g., the rear portion 62b and the front portion 62a, for allowing the second rail 26 to move relative to the first rail 24 along the opening direction D1 or the retracting direction D2 from the second extended position E2.

Figure 14:
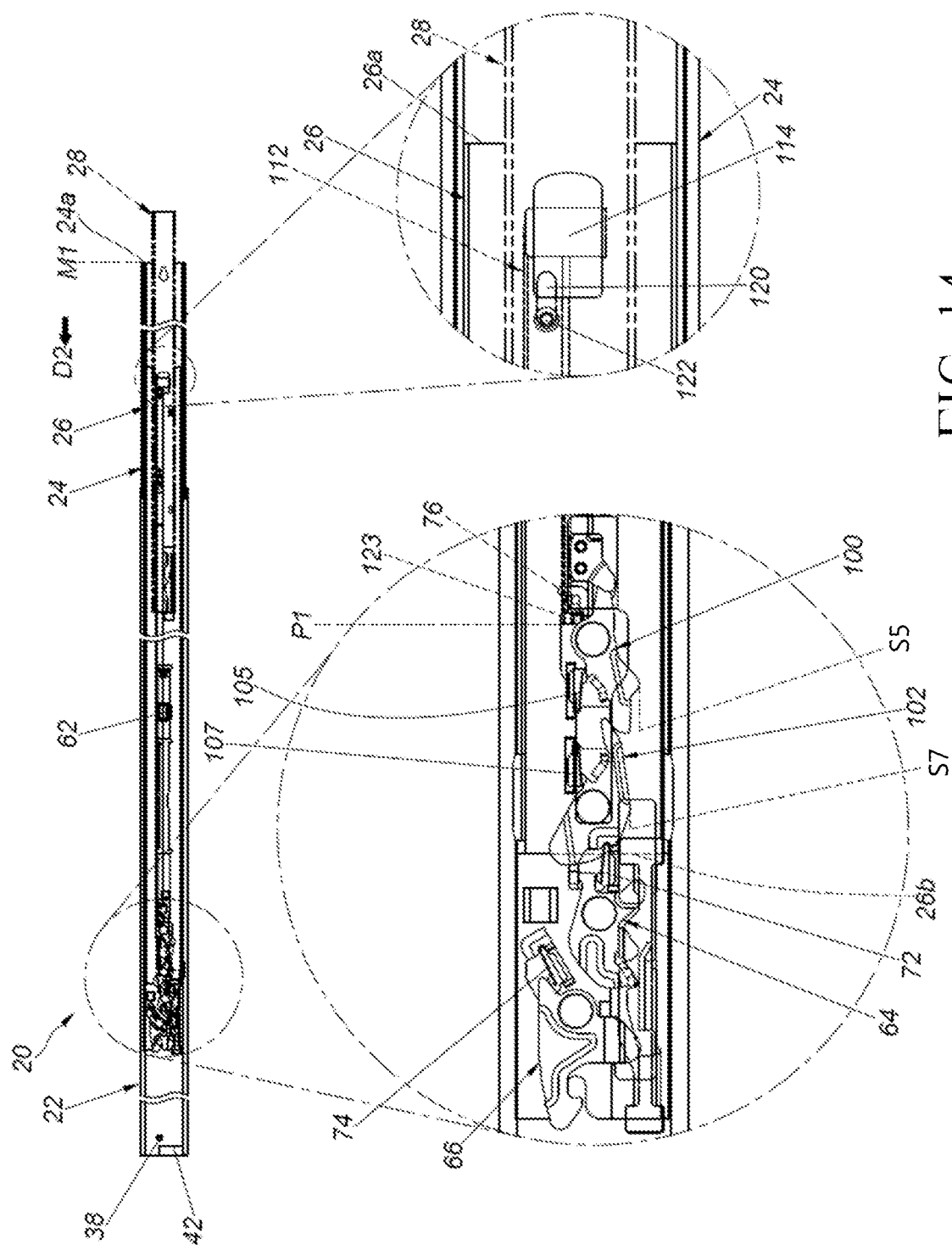
FIG. 14 is a diagram of the slide rail assembly as the second rail moves along the retracting direction from the second extended position to drive the operating member to move to the first operated position by an abutment of the first rail and the operating member according to the embodiment of the present invention.

When the second rail 26 moves relative to the first rail 24 along the retracting direction D2 from the second extended position E2 for the predetermined distance, the first auxiliary feature 76 and the second auxiliary feature 123 abut against each other for driving the operating member 112 to move along the opening direction D1 from the second operated position P2 as shown in FIG. 13 to the first operated position P1 as shown in FIG. 14, such that the third working member 100 is driven by the first resilient feature 105 to move from the sixth state S6 as shown in FIG. 13 to the fifth state S5 as shown in FIG. 14, and the fourth working member 102 is driven by the second resilient feature 107 to move from the eighth state S8 as shown in FIG. 13 to the seventh state S7 as shown in FIG. 14. Preferably, one of the first auxiliary feature 76 and the second auxiliary feature 123 can include another guiding surface, e.g., an inclined surface or an arc surface, facing toward the other one of the first auxiliary feature 76 and the second auxiliary feature 123 to facilitate the second auxiliary feature 123 to pass over the first auxiliary feature 76 along the retracting direction D2 when the second rail 26 moves relative to the first rail 24 along the retracting direction D2.

Figure 15:
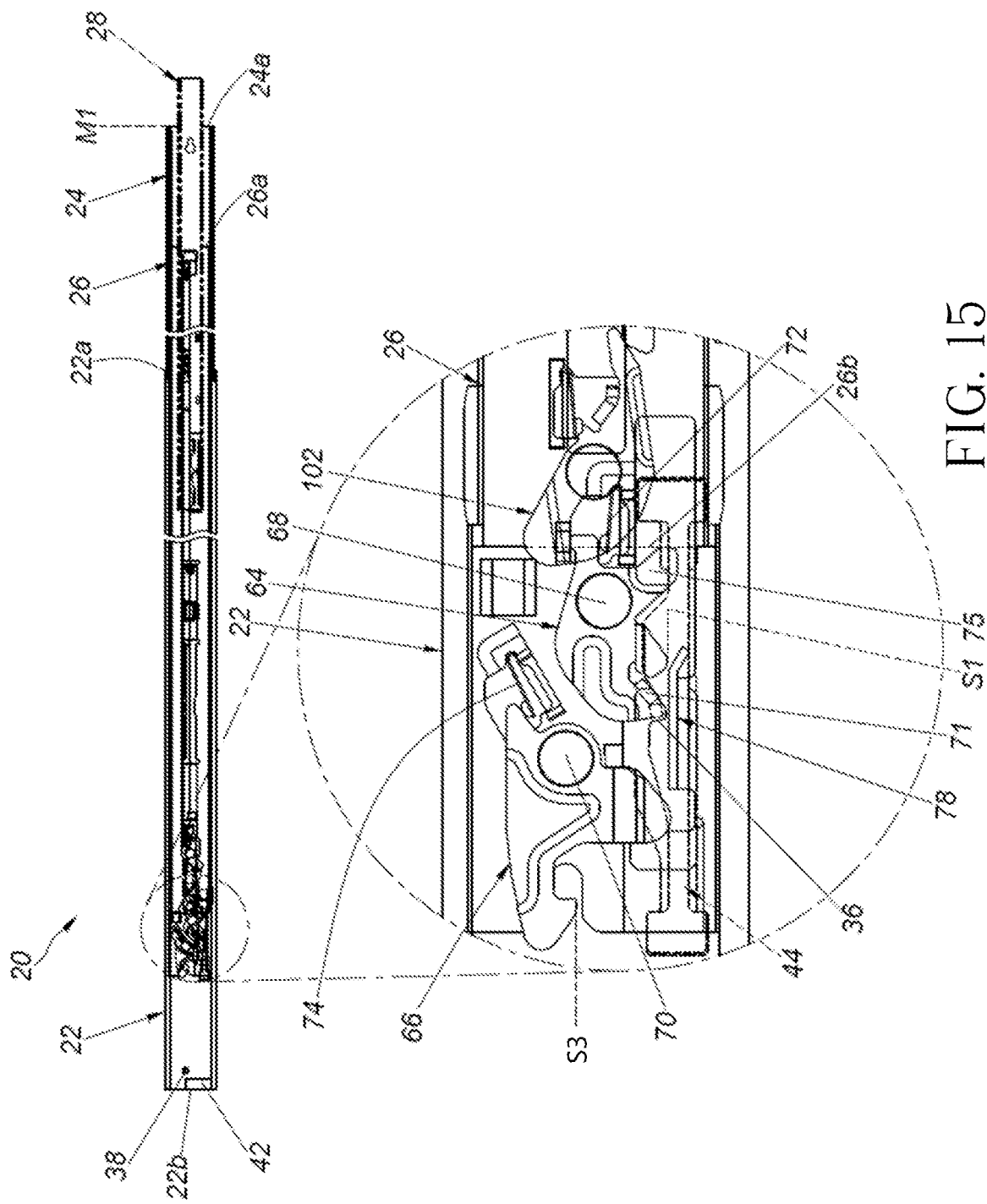
FIG. 15 is a diagram of the slide rail assembly as the second rail moves along the retracting direction from the second extended position to drive the second rail to abut against a first working member according to the embodiment of the present invention.
Figure 16:
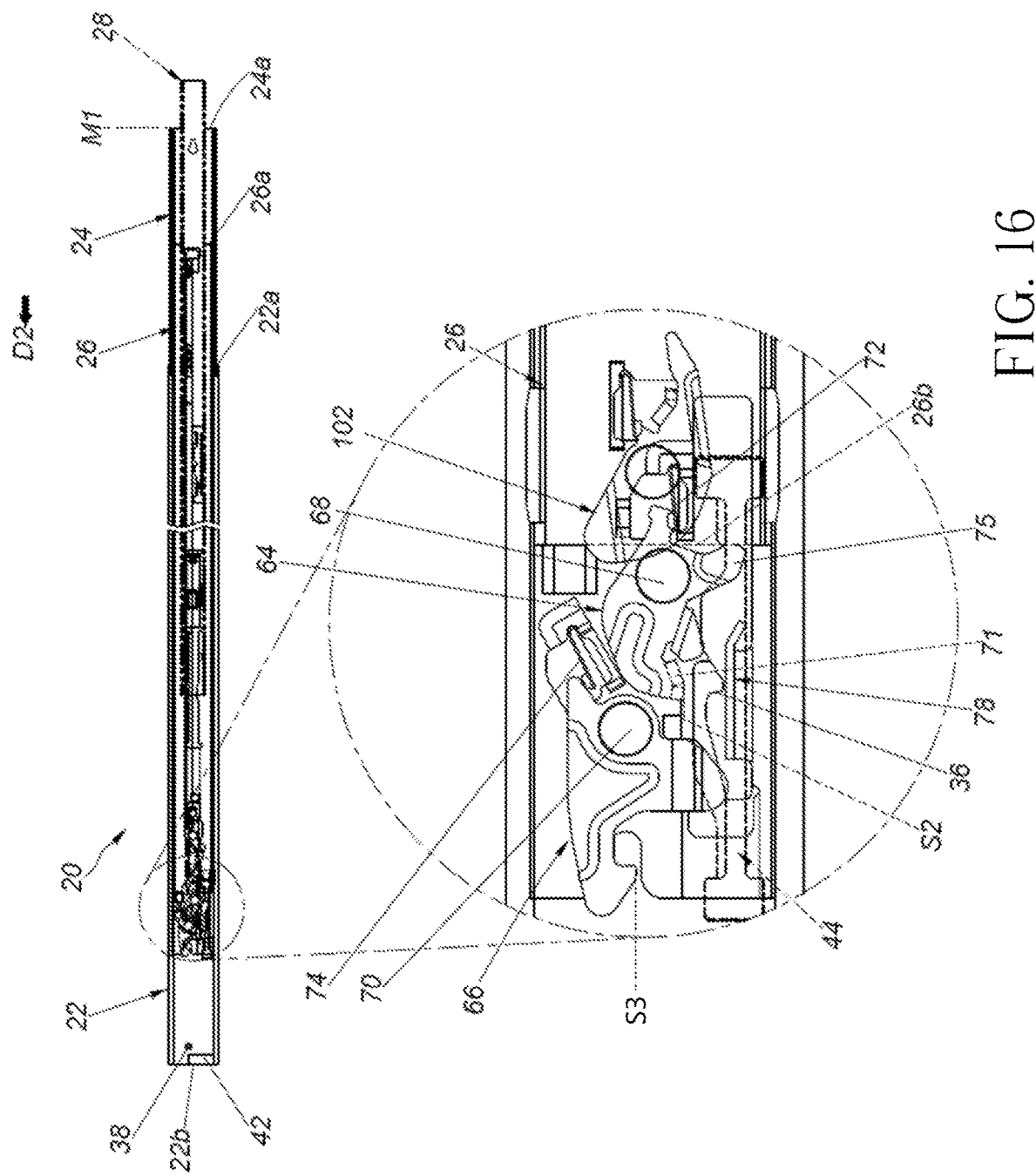
FIG. 16 is a diagram of the slide rail assembly as the second rail moves along the retracting direction from the second extended position to drive the first working member to move to a second state by an abutment of the second rail and the first working member according to the embodiment of the present invention.

When the first rail 24 is located at the first predetermined position M1 relative to the supporting frame 22, the second rail 26 can be moved along the retracting direction D2 from the second extended position E2 to abut against the releasing portion 75 of the first working member 64 by the rear portion 26b for driving the first working member 64 to move from the first state S1 as shown in FIG. 15 to the second state S2 as shown in FIG. 16, such that the blocking structure 36 of the supporting frame 22 does not block the blocking portion 71 of the first working member in the second state S2 for allowing the first rail 24 to move along the retracting direction D2 from the first predetermined position M1 to a second predetermined position M2.

Figure 17:
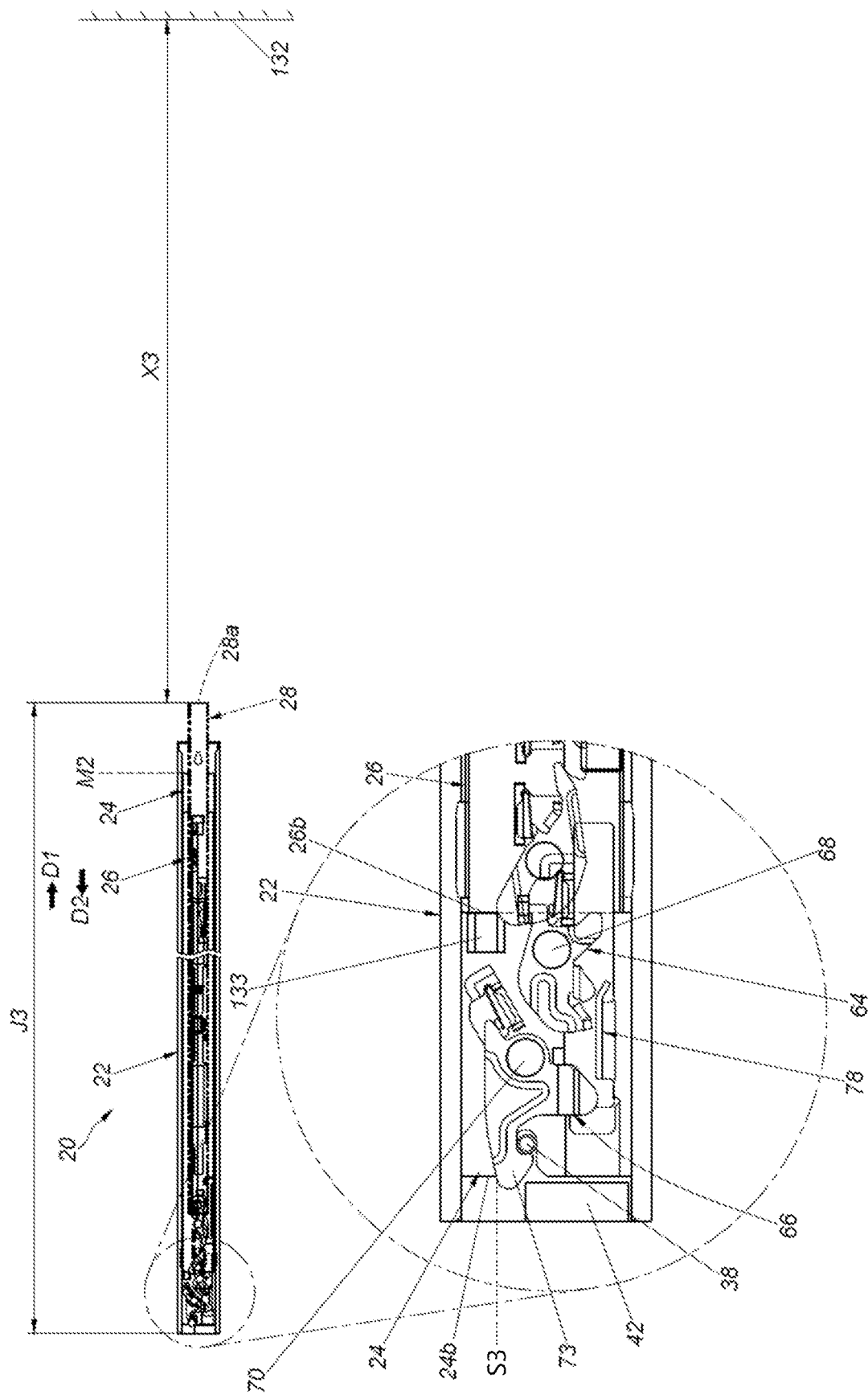
FIG. 17 is a diagram of the slide rail assembly as the first rail is locked at a second predetermined position according to the embodiment of the present invention.

As shown in FIG. 17, when the first rail 24 is located at the second predetermined position M2 relative to the supporting frame 22, the second working member 66, e.g., the positioning portion 73 of the second working member 66, in the third state S3 can engage with the positioning structure 38 of the supporting frame 22 for retaining the first rail 24 at the second predetermined position M2, so as to prevent the first rail 24 from moving along the opening direction D1 or the retracting direction D2 from the second predetermined position M2. When the first rail 24 is located at the second predetermined position M2, the slide rail assembly 20 has a third length J3 less than the second length J2, such that the front portion 28a of the third rail 28 is spaced apart from the object 132 by a third distance X3 greater than the second distance X2, which further facilitates detachment of the third rail 28 from the second rail 26, e.g., the second channel 98 of the second rail 26, along the opening direction D1.

Preferably, when the first rail 24 is located at the second predetermined position M2 relative to the supporting frame 22, the rear restraining feature 42 of the supporting frame 22 can abut against the rear portion 24b of the first rail 24 for stopping the first rail 24. The first rail 24 further includes a restraining member 133 configured to abut against the rear porting 26b of the second rail 26 for stopping the second rail 26. When the restraining member 133 abuts against the rear porting 26b of the second rail 26, the second rail 26 is fully folded relative to the first rail 24.

Figure 18:
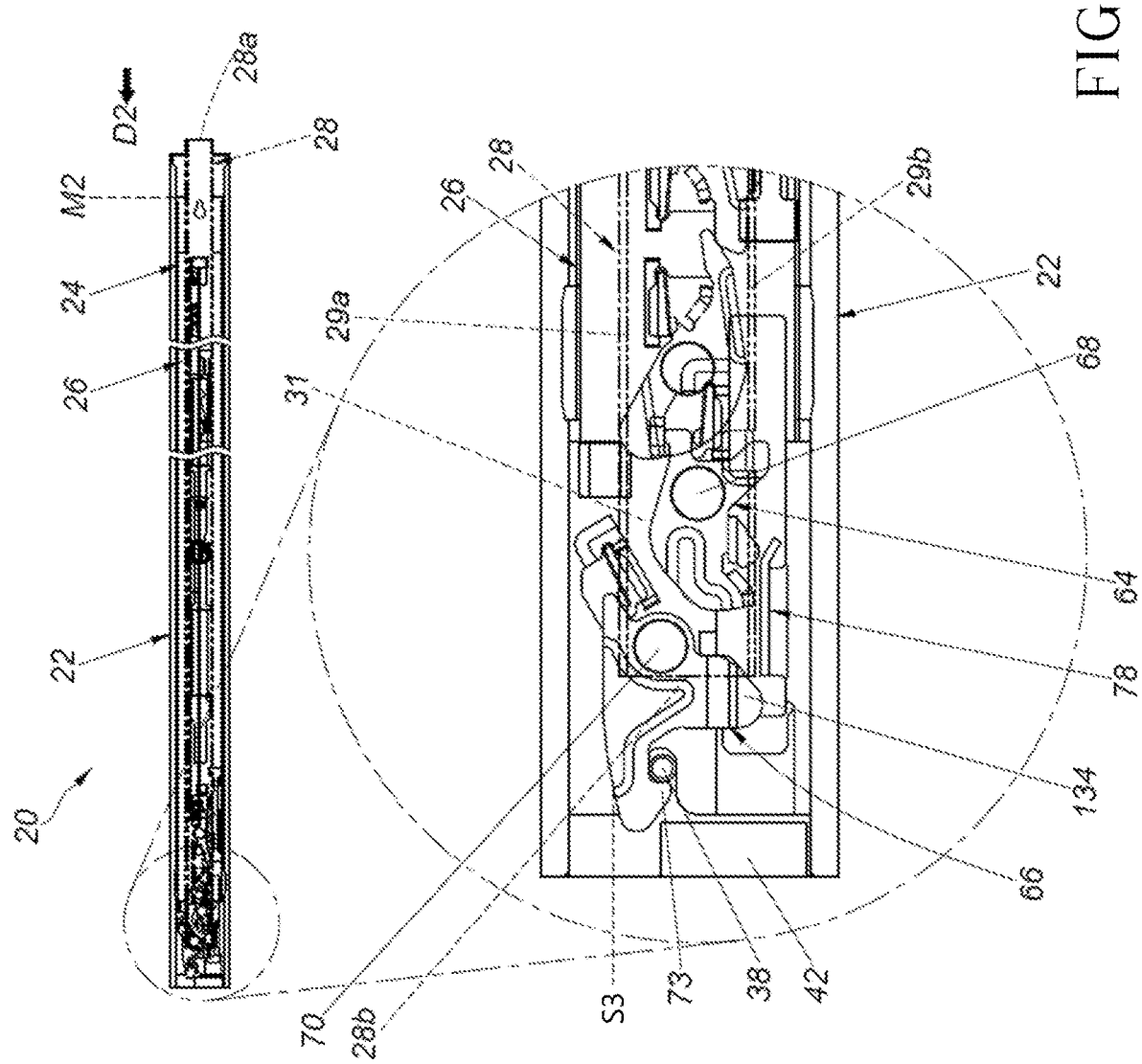
FIG. 18 is a diagram of the slide rail assembly as the third rail moves along the retracting direction to drive the third rail to abut against the second working member according to the embodiment of the present invention.
Figure 19:
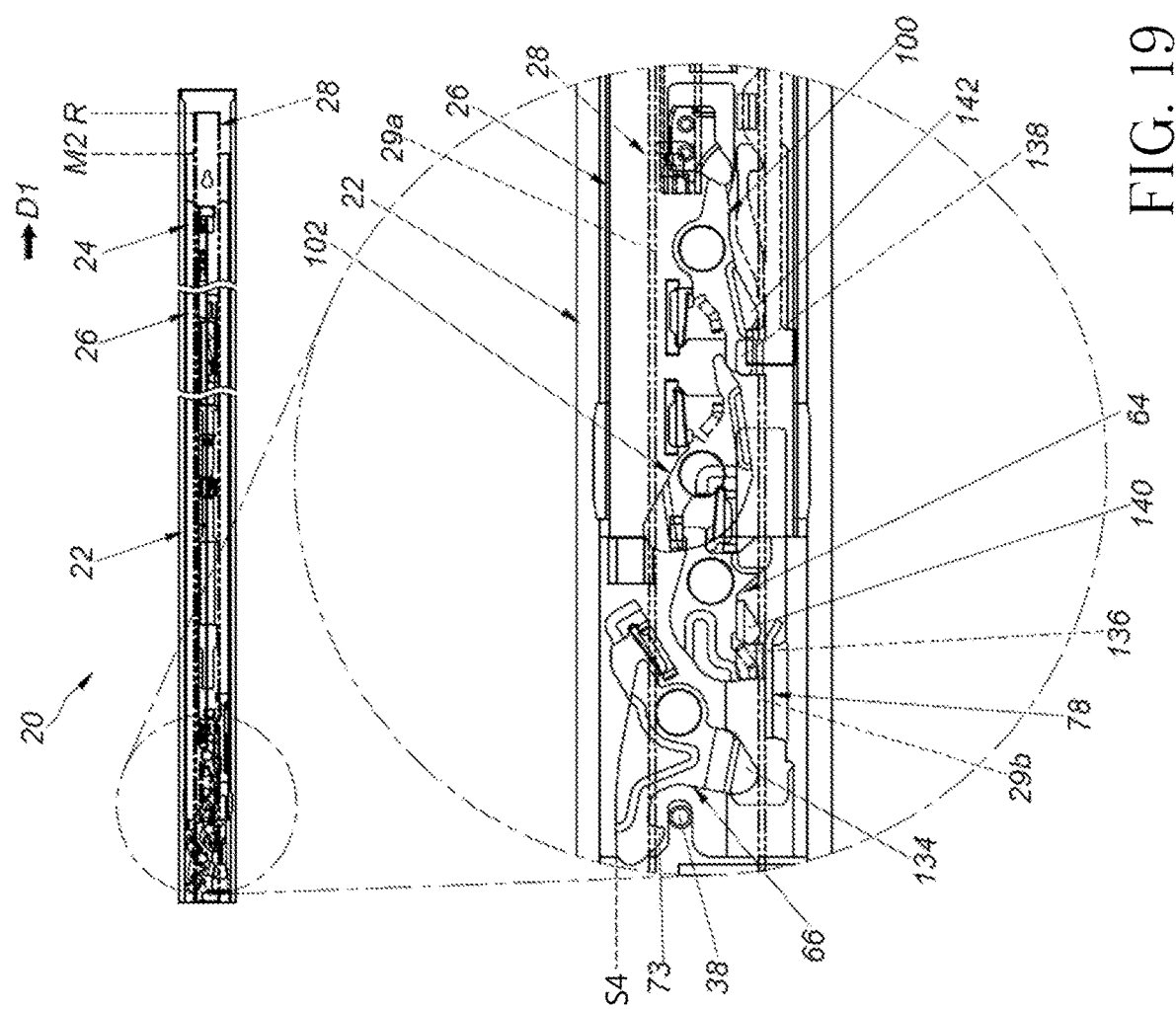
FIG. 19 is a diagram of the slide rail assembly as the third rail moves along the retracting direction to drive the second working member to move to a fourth state by an abutment of the third rail and the second working member according to the embodiment of the present invention.

As shown in FIG. 18 and FIG. 19, the third rail 28 includes a first wall 29a, a second wall 29b and a longitudinal wall 31 connected between the first wall 29a and the second wall 29b of the third rail 28. When the second rail 26 is located at the second predetermined position M2 relative to the supporting frame 22 and the second rail 26 is fully folded relative to the first rail 24, the third rail 28 is movable relative to the first rail 24 along the retracting direction D2 to a retracted position R. During a movement of the third rail 28 relative to the first rail 24 along the retracting direction D2 to the retracted position R, a portion of the third rail 28, e.g., the rear portion 28 of the third rail 28, can abut against an auxiliary portion 134, which is shown in FIG. 18, of the second working member 66 in the third state S3 for driving the second working member 66 to pivot by an angle to move from the third state S3 as shown in FIG. 18 to the fourth state S4 as shown in FIG. 19. When the third rail 28 is located at the retracted position R relative to the first rail 24, the second wall 29b of the third rail 28 supports the second working member 66 for retaining the second working member 66 in the fourth state S4, such that the positioning portion 73 of the second working member 66 is not engaged with the positioning structure 38 of the supporting frame 22 for allowing the first rail 24 to move along the opening direction D1 from the second predetermined position M2.

Preferably, as shown in FIG. 19, when the third rail 28 is located at the retracted position R relative to the first rail 24, the supporting feature 78 of the first rail 24 is configured to support a portion of the second wall 29b of the third rail 28 adjacent to a rear rail section of the third rail 28 for enhancing a structural strength of the slide rail assembly 20.

Preferably, as shown in FIG. 19, the third rail 28 further includes a first synchronizing feature 136 and a second synchronizing feature 138. During a movement of the third rail 28 along the opening direction D1 from the retracted position R, the first synchronizing feature 136 of the third rail 28 can abut against a first corresponding feature 140 of the first working member 64 for driving the third rail 28 and the first rail 24 to move synchronously along the opening direction D1 until the first rail 24 moves to the first predetermined position M1. Besides, the second synchronizing feature 138 of the third rail 28 can abut against a second corresponding feature 142 of the third working member 100 for driving the third rail 28 and the second rail 26 to be moved synchronously along the opening direction D1 until the second rail 26 moves to the first extended position E1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly comprising:
a supporting frame, a blocking structure and a positioning structure being arranged on the supporting frame;
a first rail movable relative to the supporting frame, a blocking feature and a positioning feature being arranged on the first rail;
a second rail movable relative to the first rail;
a third rail movable relative to the second rail, and the second rail being movably mounted between the first rail and the third rail;
a first working member movably mounted on the first rail and switchable between a first state and a second state relative to the first rail; and
a second working member movably mounted on the first rail and switchable between a third state and a fourth state relative to the first rail;
wherein when the first rail is located at a first predetermined position relative to the supporting frame, the blocking structure blocks the first working member in the first state for preventing the first rail from moving along a retracting direction from the first predetermined position;
wherein when the first rail is located at a second predetermined position, the second working member in the third state engages with the positioning structure for preventing the first rail from moving along an opening direction from the second predetermined position.

2. The slide rail assembly of claim 1, wherein the first working member and the second working member are pivotally connected to the first rail.

3. The slide rail assembly of claim 2, further comprising a first resilient member and a second resilient member respectively configured to provide resilient forces to the first working member and the second working member.

4. The slide rail assembly of claim 1, wherein the positioning structure is formed in a column shape.

5. The slide rail assembly of claim 1, wherein when the first rail is located at the first predetermined position relative to the supporting frame and the first working member moves from the first state to the second state, the blocking structure does not block the first working member in the second state for allowing the first rail to move along the retracting direction from the first predetermined position to the second predetermined position.

6. The slide rail assembly of claim 1, wherein when the first rail is located at the second predetermined position relative to the supporting frame and the third rail is located at a retracted position relative to the first rail, the third rail is configured to support the second working member, such that the second working member is retained in the fourth state and does not engage with the positioning structure for allowing the first rail to move along the opening direction from the second predetermined position.

7. The slide rail assembly of claim 6, wherein a supporting feature is arranged on the first rail, and the supporting feature is configured to support the third rail when the third rail is located at the retracted position relative to the first rail.

8. The slide rail assembly of claim 6, wherein the third rail comprises a synchronizing feature, and the synchronizing feature abuts against the first working member for allowing the third rail and the first rail to move along the opening direction synchronously during a movement of the third rail along the opening direction from the retracted position.

9. The slide rail assembly of claim 1, further comprising a third working member and a fourth working member, the third working member being movably mounted on the second rail and switchable between a fifth state and a sixth state relative to the second rail, the fourth working member being movably mounted on the second rail and switchable between a seventh state and a eighth state relative to the second rail, and when the second rail is located at a first extended position relative to the first rail, the blocking feature blocking the third working member in the fifth state for preventing the second rail from moving along the retracting direction from the first extended position.

10. The slide rail assembly of claim 9, wherein when the second rail is located at a second extended position relative to the first rail and the third working member and the fourth working member are respectively in the fifth state and the seventh state, the fourth working member and the third working member are respectively located at positions corresponding to two portions of the positioning feature for preventing the second rail from moving along the opening direction or the retracting direction from the second extended position.

11. The slide rail assembly of claim 10, wherein the slide rail assembly has a first length when the second rail is located at the first extended position, the slide rail assembly has a second length less than the first length when the second rail is located at the second extended position, and the slide rail assembly has a third length less than the second length when the first rail is located at the second predetermined position.

12. The slide rail assembly of claim 10, further comprising an operating member movably mounted on the second rail and configured to operate one of the third working member and the fourth working member.

13. The slide rail assembly of claim 12, wherein the third working member is driven to move from the fifth state to the sixth state to be retained in the sixth state by the operating member operably moved from a first operated position to a second operated position, such that the blocking feature does not block the third working member in the sixth state for allowing the second rail to move along the retracting direction from the first extended position, and the third working member drives the fourth working member to move to the eighth state when the third working member moves from the fifth state to the sixth state.

14. The slide rail assembly of claim 13, wherein when the second rail moves along the retracting direction from the first extended position and the third working member and the fourth working member are respectively in the sixth state and the eighth state, the third working member and the fourth working member pass over the positioning feature along the retracting direction, when the second rail moves along the retracting direction for a predetermined distance, a first auxiliary feature on the first rail abuts against a second auxiliary feature on the operating member to drive the operating member to move from the second operated position to the first operated position, such that the third working member and the fourth working member respectively driven to move to the fifth state and the seventh state by a second resilient feature.

15. The slide rail assembly of claim 12, wherein when the second rail is located at the second extended position relative to the first rail, the third working member and the fourth member are respectively driven to move to the sixth state and the eighth state by the operating member operably moved from a first operated position to a second operated position, such that the fourth working member and the third working member are respectively dislocated from the positions corresponding to the two portions of the positioning feature for allowing the second rail to move along the opening direction or the retracting direction from the second extended position.

16. The slide rail assembly of claim 9, wherein the third working member and the fourth working member are pivotally connected on the second rail.

17. A slide rail assembly comprising:
a supporting frame comprising a supporting channel, and a blocking structure and a positioning structure being arranged on the supporting frame;
a first rail at least partially movably mounted inside the supporting channel and movable relative to the supporting frame, a blocking feature and a positioning feature being arranged on the first rail;
a second rail movable relative to the first rail;
a third rail movable relative to the second rail, the second rail being movably mounted between the first rail and the third rail;
a first working member movably mounted on the first rail and switchable between a first state and a second state relative to the first rail; and
a second working member movably mounted on the first rail and switchable between a third state and a fourth state relative to the first rail;
wherein when the first rail is located at a first predetermined position relative to the supporting frame, the blocking structure blocks the first working member in the first state for preventing the first rail from moving along a retracting direction from the first predetermined position;
wherein when the first rail is located at the first predetermined position relative to the supporting frame and the first working member is driven to move from the first state to the second state by the second rail, the blocking structure does not block the first working member in the second state for allowing the first rail to move along the retracting direction from the first predetermined position to a second predetermined position;
wherein when the first rail is located at the second predetermined position relative to the supporting frame, the second working member in the third state engages with the positioning structure for preventing the first rail from moving along an opening direction from the second predetermined position.

18. The slide rail assembly of claim 17, wherein the first working member and the second working member are pivotally connected to the first rail, and the slide rail assembly further comprises a first resilient member and a second resilient member respectively configured to provide resilient forces to the first working member and the second working member.

19. The slide rail assembly of claim 17, wherein the first rail is located at the second predetermined position relative to the supporting frame and the third rail is located at a retracted position relative to the first rail, the third rail is configured to support the second working member, such that the second working member is retained in the fourth state and does not engage with the positioning structure for allowing the first rail to move along the opening direction from the second predetermined position.

20. The slide rail assembly of claim 19, wherein a supporting feature is arranged on the first rail and configured to support the third rail when the third rail is located at the retracted position relative to the first rail.

* * * * *